(12) United States Patent
Mochida

(10) Patent No.: US 7,266,037 B2
(45) Date of Patent: Sep. 4, 2007

(54) SEMICONDUCTOR MEMORY DEVICE WITH HIERARCHICAL I/O LINE ARCHITECTURE

(75) Inventor: Yoshifumi Mochida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 53 days.

(21) Appl. No.: 11/299,765

(22) Filed: Dec. 13, 2005

(65) Prior Publication Data

US 2006/0126418 A1 Jun. 15, 2006

(30) Foreign Application Priority Data

Dec. 14, 2004 (JP) .............................. 2004-362081

(51) Int. Cl.
*G11C 7/00* (2006.01)
(52) U.S. Cl. ..................... 365/230.03; 365/63
(58) Field of Classification Search ........... 365/230.03, 365/63, 233
See application file for complete search history.

(56) References Cited

U.S. PATENT DOCUMENTS 6,249,449 B1* 6/2001 Yoneda et al. ................. 365/49
6,304,509 B1* 10/2001 Hirobe et al. ........... 365/230.03
6,597,621 B2* 7/2003 Tsuji et al. ............. 365/230.03

FOREIGN PATENT DOCUMENTS

| JP | 9-73776 | 3/1997 |
|----|---------|--------|
| JP | 2000-11639 | 1/2000 |
| JP | 2000-67577 | 3/2000 |
| JP | 2000-173269 | 6/2000 |
| JP | 3252895 | 11/2001 |
| JP | 2003-346497 | 12/2003 |

* cited by examiner

*Primary Examiner*—Vu A. Le
(74) *Attorney, Agent, or Firm*—Whitham Curtis Christofferson & Cook, PC

(57) ABSTRACT

A semiconductor memory device is composed of a plurality of banks each including a plurality of sub-arrays arranged in rows and columns; global I/O lines shared by the plurality of banks; local I/O lines disposed for every a number of sub-arrays within each of the plurality of banks; I/O switch control circuits responsive to respective I/O switch timing signals for establishing connections between the global I/O lines and the local I/O lines within each of the plurality of banks; and a timing control circuit. The timing control circuit controls the I/O switch timing signals that each I/O switch timing signal remains activated until associated one of the plurality of banks gets out of a row active state after once the each I/O switch timing signal is activated.

19 Claims, 10 Drawing Sheets

SEMICONDUCTOR MEMORY DEVICE WITH HIERARCHICAL I/O LINE ARCHITECTURE

BACKGROUND OF THE INVENTION

1. Field of the Invention

The present invention relates to a semiconductor memory device, and in particular, to a synchronous semiconductor memory device.

2. Description of the Related Art

A semiconductor memory device, such as dynamic random access memories (DRAMs), often adopts multiple-bank architecture. The multiple-bank architecture allows virtually eliminating the RAS precharge time (often referred to as tRP) by alternately or sequentially activating multiple banks, and thereby effectively reduces the access time and cycle time. One recent trend is the increase in the number of banks within a semiconductor memory device for achieving the increased memory capacity and improved random access performance; the number of banks within a DRAM is typically increased up to eight or more. Another recent trend is the increase in the bit width within a semiconductor memory device, which is accompanied by the increase in the number of internal data buses. These two trends are undesirably accompanied by the increase in the chip size.

Japanese Patent Gazette No. 3,252,895 discloses semiconductor memory device architecture for avoiding the increase in the chip size due to the increase in the number of banks. In the disclosed semiconductor memory device architecture, data transmission lines are commonly used among different banks. FIG. 1A illustrates the structure of the disclosed semiconductor memory device, and FIG. 1B illustrates a detailed circuit structure of the disclosed semiconductor memory device.

Referring to FIG. 1A, the disclosed semiconductor memory device includes a pair of banks A and B in which a plurality of sub-arrays SAR are arranged in rows and columns. Sense amplifiers SA and a sub-word driver SWD are provided for each of the sub-arrays SAR in each of the banks. Referring to FIG. 1B, memory cells Cell (one shown) are arranged at intersections of sub-word lines SWL and bit lines BL and /BL. The sub-word lines extend in the X direction from the sub-word driver SWD, and the bit lines BL and /BL extends in the Y direction from the sense amplifiers SA.

The disclosed semiconductor memory device has a hierarchical I/O line structure. Specifically, a pair of local I/O lines LIO are provided along the X direction for every a number of sub-arrays SAR within each of the banks. Each pair of the local lines LIO are connected to an equalizer circuit LIOEQ. Referring back to FIG. 1A, pairs of global I/O lines GIO are provided along the Y direction. The global I/O lines GIO are commonly used between the banks A and B. Each pair of the global I/O lines GIO are connected to an equalizer circuit GIOEQ and an input/output amplifier DA/WA.

FIG. 1B illustrates a structure of each sub-array SAR. The local I/O lines LIO are connected to the global I/O lines GIO through I/O bridge switches 231 (one shown). The connections between the local I/O lines LIO and the global I/O lines GIO are controlled by SWIO control circuits 230 (one shown). The SWIO control circuits 230 are each composed of an AND circuit having a first input connected to a mat select signal line RACT_ik and a second input connected to an I/O switch line IOSW_k. A mat select signal line RACT_ik is provided for each "mat" within each bank; it should be noted that a "mat" designates one row of the sub-arrays SAR. The suffix "i" indicates the associated mat, and the suffix "k" indicates the associated bank. The mat select signal lines RACT_ik extend along the X direction. On the other hand, each IO switch line IOSW is provided for multiple columns of sub-arrays SAR. The IO switch lines IOSW_k extend along the Y direction. In response to the activation of the associated mat select signal lines RACT_ik and I/O switch lines IOSW_k, the SWIO control circuits 230 turn on the associated I/O bridge switches 231 to provide connections between the local I/O lines LIO and the global I/O lines GIO.

Additionally, bit lines BL and /BL are connected with the local I/O lines through column select switches 232 (one shown). The connections between bit lines BL and /BL and the local I/O lines LIO are controlled by column selection signal lines YSW (one shown) as shown in FIG. 1B. The column selection signal lines YSW extend from Y decoders YDEC in the Y direction. One column selection signal line YSW is provided for each column of the memory cells Cell.

In order to provide timing control of the mat select signal lines RACT_ik, the IO switch lines IOSW_k, the column selection signal lines YSW, and so forth, the semiconductor memory device further includes a timing control circuit (row/column timing control circuit) 100 and a command decoder 300, as shown in FIG. 2. The command decoder 300 decodes signals received from I/O pins to generate commands corresponding thereto. Such command scheme is one of the features of a synchronous semiconductor memory device, such as a SDRAM (synchronous DRAM). For example, the command decoder 300 outputs an ACTcmd signal indicative of an issue of an ACT command, a PREcmd signal indicative of an issue of a PRE command, and a RWcmd signal indicative of an issue of a READ or WRITE command. It should be noted that the ACT command indicates to activate a selected bank, a PRE command indicates to perform pre-charge operation for a selected bank, and READ and WRITE commands indicate to implement read and write operations, respectively.

The timing control circuit 100 is responsive to the commands received from the command decoder 300 to output a set of timing signals to desired signal lines and circuits. For example, the timing control circuit 100 provides mat select timing signal RACTS_A and RACTS_B to the banks A and B, respectively, to indicate the activation timing of the mat select signal lines RACT_iA and RACT_iB, it should be noted that the mat select signal lines RACT_iA and RACT_iB are collectively denoted by the symbol "RACT_ik" in FIG. 1B. The mat select timing signals RACTS_A and RACTS_B are indicative of whether the banks A and B are placed into a "row active state", respectively; it should be noted that the row active state designates a state in which the row address for the next access is already given to a certain bank, and the bank is waiting for a read or write operation.

In addition, the timing control circuit 100 develops column activation signal RWS_A and RWS_B, which is indicative of the activation of the selected columns of the sub-arrays SAR. The column activate signal RWS_A and RWS_B are used for developing IO switch I/O switch timing signals SWIO_A and SWIO_B on the respective IO switch lines IOSW_A and IOSW_B; it should be noted that the IO switch lines IOSW_A and IOSW_B are collectively denoted by the symbol "IOSW_k" in FIG. 1B. The I/O switch timing signals SWIO_A and SWIO_B are used to control timings when the connections between the global I/O lines GIO and the local I/O lines LIO are established. Referring to FIG. 1B, the SWIO control circuits 230 are responsive to the mat select timing signal RACTS_k and the I/O switch timing signals SWIO_k for establish the connections between the global I/O lines GIO and the local I/O lines LIO.

Moreover, the timing control circuit 100 develops column select timing signals YSWS_A and YSWS_B, which are indicative of the activation timing of the column selection signal lines YSW. In response to the activation of the column select timing signal YSWS_A or YSWS_B, a selected column select line YSW is activated, and the local I/O lines LIO are connected with the selected bit lines BL and /BL. The column select timing signals YSWS_A and YSWS_B are indicative of the timings at which the associated columns of the memory cells are activated. Moreover, the timing control circuit 100 outputs a GIO equalization timing signal /EQ to the equalizer circuits GIOEQ at desired timing. This allows each global IO line pairs to be equalized to the same potential.

In this semiconductor memory device, "data refreshing" of a selected sub-array SAR is performed as follows. In response to an issue of an ACT command, the mat select timing signal RACTS_k (RACTS_A or RACTS_B) is activated to select the bank and mat associated with the selected sub-array SAR. This is followed by activating the associated main word line and sub-word lines SWL, and this results in that cell data stored on the memory cells associated with the selected sub-word line SWL is transferred to the associated bit lines BL and /BL. Each sense amplifier amplifies the voltage between the associated bit lines BL and /BL to identify the cell data, and the identified cell data are restored onto the associated memory cells Cell. The same goes for all the associated sub-word lines SWL. This is followed by an issue of a PRE command. In response to the PRE command, the relevant mat select timing signal RACTS_k is deactivated, and the main word line and the sub-word line SWL associated therewith are deactivated. After the memory cells are disconnected from the bit lines BL and /BL, the sense amplifiers SA are deactivated and the bit lines BL and /BL are equalized. This completes the data refreshing operation.

Data write operation into a selected memory cell within a selected sub-array SAR is performed as follows. In response to an issue of an ACT command, the mat select timing signal RACTS_k associated with the selected bank is activated, and the bank and mat associated with the selected sub-array SAR is selected and activated. In response to an issue of an RW command, write data is then transferred to the global I/O lines GIO via the input/output amplifier DA/WA. Desired one of the I/O switch timing signals SWIO_k is then activated in response the activation of the associated column activation signal RWS_k, and the local I/O lines LIO associated with the selected sub-array SAR is connected to the global I/O lines GIO. This is followed by connecting the bit lines BL and /BL associated with the selected memory cell with the associated local I/O lines LIO in response to the activation of the column select timing signal YSWS_k. As a result, the data on the global GIO is written into the selected memory cell through the local I/O lines LIO and the bit lines BL and /BL.

Data read operation from a selected memory cell within a selected sub-array SAR is performed as follows. In response to an issue of an ACT command, desired one of the mat select timing signals RACTS_A and RACTS_B is activated to select the bank and mat associated with the selected sub-array SAR. This is followed by activating the column activation signal RWS_k in response to an issue of an RW command, the desired IO switch timing signal SWIO_k is activated on the desired IO switch line IOSW_k. This results in that the local I/O lines LIO associated with the selected sub-array SAR is connected to the global I/O lines GIO. This is followed by connecting the bit lines BL and /BL associated with the selected memory cell with the local I/O lines LIO in response to the activation of the associated column select timing signal YSWS_k. As a result, the data stored in the selected memory cell is read to the local I/O lines LIO through the bit lines BL and /BL, and is transferred to the input/output amplifier DA/WA via the global I/O lines GIO.

FIG. 3 is a block diagram showing a structure of the conventional timing control circuit 100. The timing control circuit 100 receives an internal clock ICLK through a delay circuit 210. The timing of the received internal clock ICLK is adjusted by the delay circuit 210 so as to satisfy timing requirements, such as setup and hold times with respect to input data, including bank addresses. The conventional timing control circuit 100 includes first to fourth logic circuits 110, 120, 130, and 140.

The first logic circuit 110 generates the GIO equalization timing signal /EQ. Specifically, the first logic circuit 110 includes an AND gate 111, a delay circuit 112, and a buffer 113. The AND gate 111 receives the internal clock ICLK and the RWcmd signal on the inputs thereof, and outputs the results of the logical AND operation to the delay circuit 112. The output signal of the AND gate 111 is transferred to the equalizer circuits GIOEQ through the delay circuit 112 and the buffer 113, and used as the GIO equalization timing signal /EQ. Here, the delay time of the GIO equalization timing signal /EQ is adjusted to "tD1" by the delay circuit 112. The equalizer circuits GIOEQ are required to equalize the global I/O lines GIO, while none of the column selection signal lines YSW are not selected, and also to stop equalizing the global I/O lines GIO so as not to corrupt data on the GIO when the desired column select signal line YSW is selected. The delay time tD1 of the GIO equalization timing signal /EQ is adjusted to satisfy such timing requirements.

The second logic circuit 120 generates the column select timing signals YSWS_A and YSWS_B; it should be noted that FIG. 3 only illustrates the circuitry associated with one of the column select timing signals YSWS_A and YSWS_B, and the symbol "YSWS_k" collectively denotes the column select timing signals YSWS_A and YSWS_B. The second logic circuit 120 includes an AND gate 121, a delay circuit 122, and a buffer 123 for each of the column select timing signals YSWS_A and YSWS_B. The AND gate 121 receive the internal clock ICLK, the RWcmd signal, and a bank address selection signal ADD_BA indicative of the selection of the associated bank address, and outputs the result of the logic operation to the delay circuit 122. The output signal of the AND gate 121 is transferred to Y decoders YDEC through the delay circuit 122 and the buffer 123, and used as the column select timing signal YSWS_k. Here, the delay time of the column select timing signal YSWS_k is adjusted to "tD2" by the delay circuit 122. The Y decoders (YDEC) receive the column select timing signal YSWS_k and a column address signal ADD_COL for identifying the selected memory cell, to activate the corresponding column select signal line YSW. The delay time tD2 of the timing signal YSWS_k is adjusted so as to satisfy timing skew requirements with respect to the column address signal ADD_COL.

The third logic circuit 130 generates the column activation signals RWS_A and RWS_B; it should be noted that FIG. 3 only illustrates the circuitry associated with one of the column activation signal RWS_A and RWS_B, and the symbol "RWS_k" collectively denotes the column activation signal RWS_A and RWS_B. The third logic circuit 130 includes an AND gate 131, a D-flipflop 132, a delay circuit 133, and a buffer 134 for each of the column activation signal RWS_A and RWS_B. The AND gate 131 receives the RWcmd signal and the bank address selection signal ADD_BA, and outputs the result of the logic operation to the D-flipflop 132. The D-flipflop 132 latches the output of the AND gate 131 upon the pull-up of the internal clock ICLK to the "High" level (or upon the rising edge). The output signal of the D-flipflop 132 is outputted through the delay circuit 133 and the buffer 134, and used as the column activation signal RSW_k. The column activation signal RSW_k is transferred to buffers developing the I/O switch timing signals SWIO_k within each bank. The I/O switch timing signals SWIO_k are fed to the SWIO control circuits 230. Here, the delay time of the column activation signal RSW_k is adjusted to "tD3" by the delay circuit 133. The delay time tD3 is adjusted so as to switch the I/O switch timing signals SWO_k while none of the column select signal lines YSW is selected.

The fourth logic circuit 140 generates the mat select timing signal RACTS_A and RACTS_B; it should be noted that FIG. 3 only illustrates the circuitry associated with one of the mat select timing signal RACTS_A and RACTS_B, and the symbol "RACTS_k" collectively denotes the mat select timing signal RACTS_A and RACTS_B. The fourth logic circuit 140 includes a pair of AND gates 141 and 142, an SR flipflop 143, a delay circuit 144, and a buffer 145 for each of the mat select timing signal RACTS_A and RACTS_B. The AND gate 141 receives the ACTcmd signal, the internal clock ICLK, and the bank address selection signal ADD_BA, and outputs the result of the logic operation to the S input of the SR flipflop 143. The AND gate 142 receives the PREcmd signal, the internal clock ICLK, and the bank address selection signal ADD_BA, and outputs the result of the logic operation to the R input of the SR flipflop 143. The SR flipflop 143 is set by the output of the AND gate 141, and reset by the output of the AND gate 142. The output signal of the flip-flop 143 is outputted through the delay circuit 144 and the buffer 145, and used as the mat select timing signal RACTS_k. The mat select timing signal RACTS_k is fed to a mat selector circuit 220 associated therewith. Here, the delay time of the mat select timing signal RACTS_k is adjusted to "tDR" by the delay circuit 144. The mat selector circuit 220 receives the mat select timing signal RACTS_k and row address signals ADD_ROW to select the mat select signal lines RACT_ik. The delay time tDR of the mat select timing signal RACTS_k is adjusted so as to satisfy timing skew requirements with respect to the row address signals ADD_ROW.

FIG. 4 is a timing chart showing an exemplary operation of the conventional semiconductor memory device. In this operation, the burst length is set to four. The duration of the cycle of the internal clock ICLK is referred to as the symbol "tCK", and the duty ratio of the internal clock ICLK is set to 50%. Read operations of the banks A and B are alternately implemented.

Initially, the bank A is deactivated with the mat select timing signal RACTS_A set to the "low" level, and the bank BANK_B is activated with the mat select timing signal RACTS_B set to the "High" level.

The read operation of the bank A begins with an issue of an ACT_A command that indicates the timing control circuit 100 to activate the bank A. The ACT_A command is latched at a time T0. The fourth logic circuit 140 activates the mat select signal RACTS_A (that is, pulls up the mat select signal RACTS_A to the "High" level), after a lapse of the delay time tDR(Rise) from the time T0.

At a time T1 within the next clock cycle, a read command R1_B is issued for the bank B. In response to the read command R1_B, the first logic circuit 110 deactivates the GIO equalization timing signal /EQ after a lapse of the delay time tD1, and the second and third logic circuits 120 and 130 activate the column select timing signal YSWS_B and the IO switch timing signal SWIO_B, after a lapse of the respective delay times tD2, and tD3 from the time T1, respectively. In response to the deactivation of the GIO equalization timing signal /EQ (that is, the pull-up of the timing signal /EQ to the "high" level), the equalization of the global I/O lines GIO is stopped. In addition, in response to the activation of the timing signals SWIO_B and YSWS_B, the global I/O lines GIO are connected to the local I/O lines LIO associated with the selected mat within the bank B (which are denoted by LIO_B, hereinafter), and the local I/O lines LIO_B are connected to the bit lines BL and /BL. Consequently, the data read by the sense amplifier SA_B associated with the selected memory cell is transferred to the global I/O lines GIO via the local I/O lines LIO within the bank BANK_B. It should be noted that the data transfer is performed during the next clock cycle of the clock cycle when the read command R1_B for the bank BANK_B is issued.

After the data transfer is completed, the GIO equalization timing signal /EQ is activated to equalize the global I/O lines GIO, and the column select timing signal YSWS_B is deactivated to disconnect he selected bit lines BL and /BL from the local I/O lines LIO_B. The IO switch timing signal SWIO_B is then deactivated to disconnect the local I/O lines LIO_B from the global I/O lines GIO.

At a time T2 within the next clock cycle, a read command R1_A is issued for the bank A. In response to the read command R1_A, the GIO equalization timing signal /EQ is deactivated after a lapse of the time tD1 from the time T2, and the column select timing signal YSWS_A and the IO switch timing signal SWIO_A. are activated and set to the "High" level. In response to the activation of the column select timing signal YSWS_A and the IO switch timing signal SWIO_A, the global I/O lines GIO are connected to the local I/O lines LIO associated with the selected mat within the bank A (referred to as the local I/O lines LIO_A), and also the selected local I/O lines LIO_A are connected to the selected bit lines BL and /BL. Consequently, the data read by the sense amplifier SA_A associated with the selected bit lines BL and /BL is transferred to the global I/O lines GIO via the local I/O lines LIO_A.

After the data transfer is completed, the GIO equalization timing signal /EQ is activated to equalize the global I/O lines GIO, and the column select timing signal YSWS_A is deactivated to disconnect the selected bit lines BL and /BL from the local I/O lines LIO_A. The IO switch timing signal SWIO_B is then deactivated to disconnect the local I/O lines LIO_A from the global I/O lines GI.

Subsequently, a read command R1'_B is issued for the bank B at a time T3 within the next clock cycle, and a read command R1'_A is then issued for the bank A at a time T4 within the following clock cycle. It should be noted that the read command R1'_A for the bank A indicates to initiate a burst read operation of the bank A. In response to the successive issues of the read command R1'_B, and read command R1'_A, the I/O switch timing signals SWIO_B and SWIO_A are successively activated after lapses of the delay time tD3 from the times T3 and time T4, respectively, to establish connections of the relevant local I/O lines within the banks A and B with the global I/O lines GIO. Consequently, the read operation of the bank B is performed, and then the first burst cycle of the burst read operation of the bank A is performed.

At a time T5 within the next clock cycle, a PRE_B command is issued to indicate the deactivation of the bank B. After a lapse of the delay time tDR(fall) from the time T5, the mat select signal RACTS_B is pulled down to the "Low" level to deactivate the bank B.

During this clock cycle, the second burst cycle of the burst read operation of the bank A is performed. Here, the IO switch timing signal SWIO_A remains activated from the previous clock cycle, and the connections between the global I/O lines GIO and the selected local I/O lines LIO_A are maintained.

Subsequently, the third and fourth burst cycles are performed with respect to the bank A at times T6 and T7, respectively. Here, the I/O switch timing signal SWIO_A also remains activated and the connections between the global I/O lines GIO and the selected local I/O lines LIO_A are maintained. At a time T8, the PRE_A command is issued to indicate the deactivation of the bank A, and the bank A is then deactivated after a lapse of the delay time tDR(Fall) from the time T8.

In order to implement the above stated operations, the delay times tD1 to tD3 are configured so as to satisfy requirements described below. Firstly, it is necessary to stop the equalization of the global I/O lines GIO so as not to corrupt the data thereon, when any of the column select signal lines YSW is activated. To satisfy this requirement, the delay time tD1 of the GIO equalization timing signal /EQ is determined as being equal to the delay time tD2 of the column select timing signals YSWS_A and YSWS_B.

Additionally, in order to prevent the global I/O lines GIO from being affected by noise due to the switching of the I/O switch timing signals SWIO_A and SWIO_B, the I/O switch timing signals SWIO_A and SWIO_B are switched while none of the column select signal lines YSW is activated. More specifically, the delay time tD3 of the I/O switch timing signals SWIO_A and SWIO_B (or of the column activation signals RSW_A and RWS_B) is set so as to satisfy the following equation:

$$tD1 - \tfrac{1}{2}tCK < tD3 + \alpha < tD1, \qquad (1)$$

where α denotes a delay time within the SWIO control circuits 230. From this equation (1), the following equations can be obtained, which express a margin t1 between the activation timings of the I/O switch signals SWIO_A and SWIO_B and the column select timing signals YSWS_A and YSWS_B, and a margin t2 between the deactivation timings of the I/O switch signals SWIO_A and SWIO_B and the column select timing signals YSWS_A and YSWS_B:

$$t1 = tD1 - (tD3 + \alpha), \text{ and} \qquad (2)$$

$$t2 = (tD3 + \alpha) - (tD1 - \tfrac{1}{2}tCK) \qquad (3)$$

As shown above, the conventional semiconductor memory device architecture allows the data transfer I/O lines to be commonly used among the different banks. Also, in order to eliminate the influence of noise on the global I/O lines GIO, the I/O switch timing signal SWIO_k associated with the selected bank is activated during the "column access" to the target bank. In other words, the I/O switch timing signal SWIO_k is activated or deactivated in synchronization with column cycles or CAS cycles.

One drawback of the above-described operation is the increase in the operating current due to frequent switching of the I/O switch timing signals SWIO_A and SWIO_B. The I/O switch timing signals SWIO_A and SWIO_B are turned on/off in a cycle of column selection (hereinafter referred to as "column cycle"), when read operations of the banks A and B are alternately performed. This undesirably increases the operating current of the memory device. The increase in the operating current is enhanced due to the recent increase in the number of IO switch lines IOSW from the requirement for wide bit width configuration. Thus, there is a need for providing a technique for reducing the operating current of the semiconductor memory device.

There is also a need for providing a sufficient timing margin to thereby stabilize the high-speed (or high-frequency) operations. In order to reduce noise influence resulting from switching of the I/O switch timing signals SWIO_A and SWIO_B, it is necessary to sufficiently provide the margin t1 expressed by equation (2). The margin t1, however, could not be provided even by setting the delay time tD3 to zero, when the delay time tD1 is further shortened with advances in circuit and processing technologies. This would interfere with the implementation of high-speed and high-frequency operations. Therefore, it is desired to provide a technology for improving the stability in high-speed (or high-frequency) operations.

As for the margin t2 expressed by equation (3), no noise effect will be caused by switching the I/O switch timing signals SWIO_A and SWIO_B, because the operations of the data amplifier is completed before the column select timing signal YSWS_A and YSWS_B are deactivated. The semiconductor memory device is operable even with the margin t2 less than 0 by sufficiently providing a margin between the time when the I/O switch timing signal SWIO_A and SWIO_B are switched and the time when the operation of the data amplifier is completed. In general, no problem will occur even with the margin t2 set to zero.

The following is descriptions of other related arts. Firstly, Japanese Laid Open Patent Application No. JP-A-Heisei 9-73776 discloses a synchronous semiconductor memory device that includes data terminals used for external data input/output, and memory arrays associated with the respective data terminals. Each memory array is divided into a plurality of banks operating independently from one another, which are aligned in the direction of the memory cell rows. The banks within each memory array are respectively provided with global I/O buses, and the global IO buses are electrically connected to the same data terminal.

Japanese Laid Open Patent Application No. Jp-A 2000-11639 discloses a semiconductor memory device in which a memory cell array is divided into a plurality of banks arranged in the word line direction of the memory cell array. Each of the banks is further divided into a plurality of sub-blocks arranged in the word line direction. The corresponding sub-blocks within the respective banks are addressed by the same column address. Access to memory cells selected by the address is implemented for each of the sub-blocks. The activation of the sub-blocks is carried out by a control circuit provided for the sub-blocks, on the basis of signals activated in response to the address signal for each of the banks and sub-blocks.

Japanese Laid Open Patent Application No. Jp-A 2000-173269 discloses a semiconductor memory device that includes a plurality of memory cell blocks arranged in the bit line direction, a plurality of local data line pairs (LIOs), a global data line pair (GIO), a plurality of read gate amplifiers, and a current supply load circuit. The local data line pairs LIOs are associated with the plurality of memory blocks, and each of the local data line pairs LIO is electrically connected with the associated memory block. The global data line pair GIO is commonly used among the plurality of memory blocks. The read gate amplifiers are provided between the associated local data line pairs LIO and the global data line pair GIO, and the current supply load circuit is connected with the global data line pair GIO. Here, the read gate amplifiers are designed to transfer signals from the associated local data lines LIO to the global data line GIO with the local data lines LIO and the global data line GIO disconnected electrically. In addition, the current supply load circuit is design to develop currents of same magnitude on the data lines of the global data line pair.

Japanese Laid Open Patent Application No. JP-A 2003-346497 discloses a semiconductor memory device that includes a row address latch circuit for latching an externally-provided row address input in synchronization with a timing signal, a column address latch circuit for latching a column address input from outside in synchronization with the timing signal, a command decoder, and a row address pre-latch circuit. The command decoder, upon an issue of a command requesting the semiconductor memory device to be placed into the test mode, generates a test mode signal for a predetermined period. In addition, when other commands are issued which request the semiconductor memory device to be placed into the normal operation mode, the command decoder generates command signals associated with the issued commands. The row address pre-latch circuit holds a row address except for a bank address input together with a pre-charge command, and outputs the row address to the row address latch circuit.

Japanese Laid Open Patent Application No. 2000-67577 discloses a synchronous semiconductor memory device in which the distribution methods of the internal clock signal are changeable in accordance with system operation modes. When placed into a single data rate SDRAM operation mode, the synchronous semiconductor memory device operates an input/output buffer circuit in synchronous with an external clock signal. When place into a double data rate SDRAM operation mode, on the other hand, the synchronous semiconductor memory device generates an internal clock signal having a frequency twice of the external clock signal, and operates the input/output buffer circuit in synchronous with the internal clock signal.

SUMMARY OF THE INVENTION

Therefore, an object of the present invention is to provide a semiconductor memory device with a reduced operating current.

Another object of the present invention is to provide a semiconductor memory device superior in the stability of high-speed (or high-frequency) operation.

In an aspect of the present invention, a semiconductor memory device is composed of a plurality of banks each including a plurality of sub-arrays arranged in rows and columns; global I/O lines shared by the plurality of banks; local I/O lines disposed for every a number of sub-arrays within each of the plurality of banks; I/O switch control circuits responsive to respective I/O switch timing signals for establishing connections between the global I/O lines and the local I/O lines within each of the plurality of banks; and a timing control circuit. The timing control circuit controls the I/O switch timing signals that each I/O switch timing signal remains activated until associated one of the plurality of banks gets out of a row active state after once the each I/O switch timing signal is activated.

Preferably, the timing control circuit activates the one of the I/O switch timing signals in response to the associated one of the plurality of banks being placed into the row active state, and deactivates the one of the I/O switch timing signals in response to the associated one of the plurality of banks getting out of the row active state.

It is also preferably that the timing control circuit switches the I/O switch timing signals with associated ones of column select timing signals deactivated, the column select timing signals being indicative of timings of establishing connections between selected bit lines and the local I/O lines within the plurality of banks associated therewith.

In this case, the timing control circuit may include: a row logic circuit developing row select timing signals indicative of respective timings of activations of selected rows of the subarrays within the plurality of banks associated therewith; an I/O logic circuit developing the I/O switch timing signals; and a column logic circuit developing the column select timing signals.

In a preferred embodiment, the row logic circuit may be composed of a first latch circuit latching command signals indicative of issues of commands indicating activation and deactivation of associated one of said plurality of banks in synchronization with an internal clock signal, the first latch circuit developing associated one of the row select timing signals on output thereof. In this case, the column logic circuit develops the column select timing signals in synchronization with the internal clock signal, and the I/O logic circuit is composed of a second latch circuits latching the associated one of the row select timing signals from the first latch circuit in synchronization with the internal clock signal to develop associated one of the I/O switch timing signals.

In this case, the first latch circuit may latch the command signals upon rising edges of the internal clock signal, and the second latch circuit may latch the associated one of the row select timing signals upon falling edges of the internal clock signal.

Preferably, the column logic circuit and the I/O logic circuit are designed to establish the following equation:

$$tD3+\alpha<tD1+\tfrac{1}{2}tCK,$$

where tCK is a duration of a cycle of the internal clock signal, tD1 is a delay time of the column logic signal, tD3 is a delay time of the I/O logic circuit, and α is a delay time of the I/O switch control circuits.

It would be further preferable, the column logic circuit and the I/O logic circuit are designed to further establish the following equation:

$$tD1<tD3+\alpha.$$

In a preferred embodiment, the semiconductor memory device may further include selector circuits responsive to the respective row select timing signals to develop row select signals selecting the respective rows of the sub-arrays within each of the plurality of banks. In this case, the I/O switch control circuits each comprise an AND gate receiving associated one of the I/O switch timing signals, and associated one of the row select signals.

In another preferred embodiment, the I/O switch control circuits may each receive associated one of the I/O switch timing signals and associated one of the row select signals, and establishes connections between the global I/O lines and the local I/O lines associated therewith in response to activation of both of the associated one of the I/O switch timing signals and the associated one of the row select signals, while disconnects the global I/O lines from the local I/O lines associated therewith in response to deactivation of the associated one of the I/O switch timing signals.

In this case, the I/O switch control circuits may each include: a P-channel transistor having a source connected to a power supply terminal; a first N-channel transistor having a drain connected to a drain of the P-channel transistor; and a second N-channel transistor having a source connected to an earth terminal and a drain connected to a source of the N-channel transistor. In this case, the associated one of the I/O switch timing signals is fed to commonly-connected gates of the P-channel transistor and the first N-channel transistor, and the associated one of the row select signals is fed to a gate of the second N-channel transistor.

In still another preferred embodiment, the row logic circuit may include a first latch circuit latching command signals indicative of issues of commands indicating activation and deactivation of the plurality of banks in synchronization with an internal clock signal, the first latch circuit developing the row select timing signals on outputs thereof. In this case, the column logic circuit develops the column select timing signals in synchronization with the internal clock signal, and the I/O logic circuit includes: a flipflop designed to be set in response to an issue of a read command indicating a read operation of associated one of the plurality of banks, and to be reset in response to an issue of commands indicating deactivation of the associated one of plurality of banks; and a second latch circuit latching an output signal of the flipflop in synchronization with the internal clock signal to develop associated one of the I/O switch timing signals.

The second latch circuit may latch the output signal of the flipflop upon rising edges of the internal clock signal. In this case, the column logic circuit and the I/O logic circuit are preferably designed to establish the following equation:

$$tD3+\alpha<tD1,$$

where tD1 is a delay time of the column logic signal, tD3 is a delay time of the I/O logic circuit, and $\alpha$ is a delay time of the I/O switch control circuits. It would be further preferable that the column logic circuit and the I/O logic circuit are designed to further establish the following equation:

$$tD1-\tfrac{1}{2}tCK<tD3+\alpha,$$

where tCK is a duration of a cycle of the internal clock signal.

In another aspect of the present invention, a semiconductor memory device is composed of a plurality of banks each including a plurality of sub-arrays arranged in rows and columns; global I/O lines shared by the plurality of banks; local I/O lines disposed for every a number of sub-arrays within each of the plurality of banks; I/O switch control circuits responsive to respective I/O switch timing signals for establishing connections between the global I/O lines and the local I/O lines within each of the plurality of banks: and a timing control circuit activating and deactivating the I/O switch timing signals in synchronization with RAS cycles.

The semiconductor memory device architecture of the present invention is especially suitable for a synchronous dynamic random access memory.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1A:
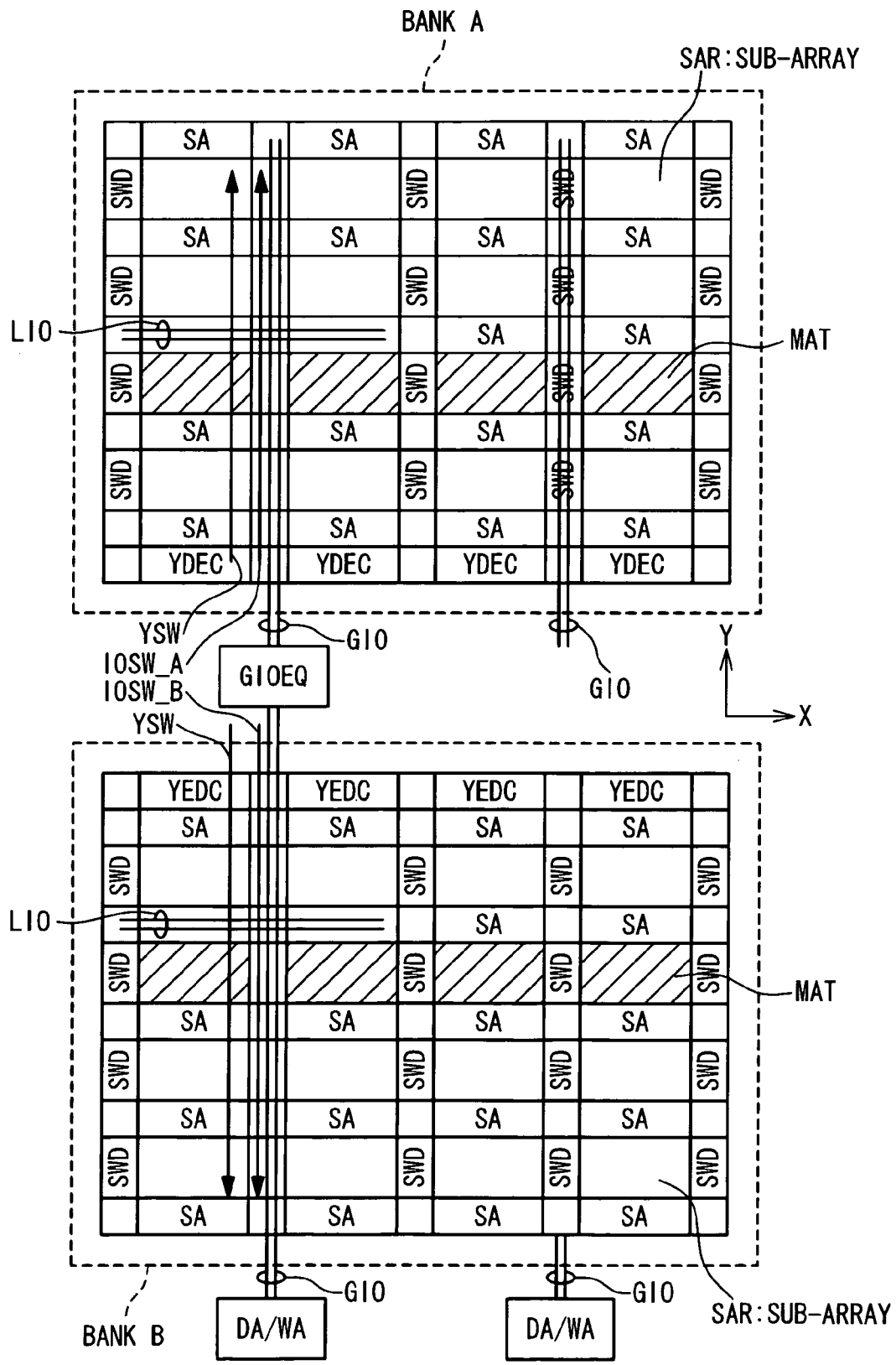
FIG. 1A is a schematic diagram illustrating an exemplary structure of a conventional semiconductor memory device.
Figure 1B:
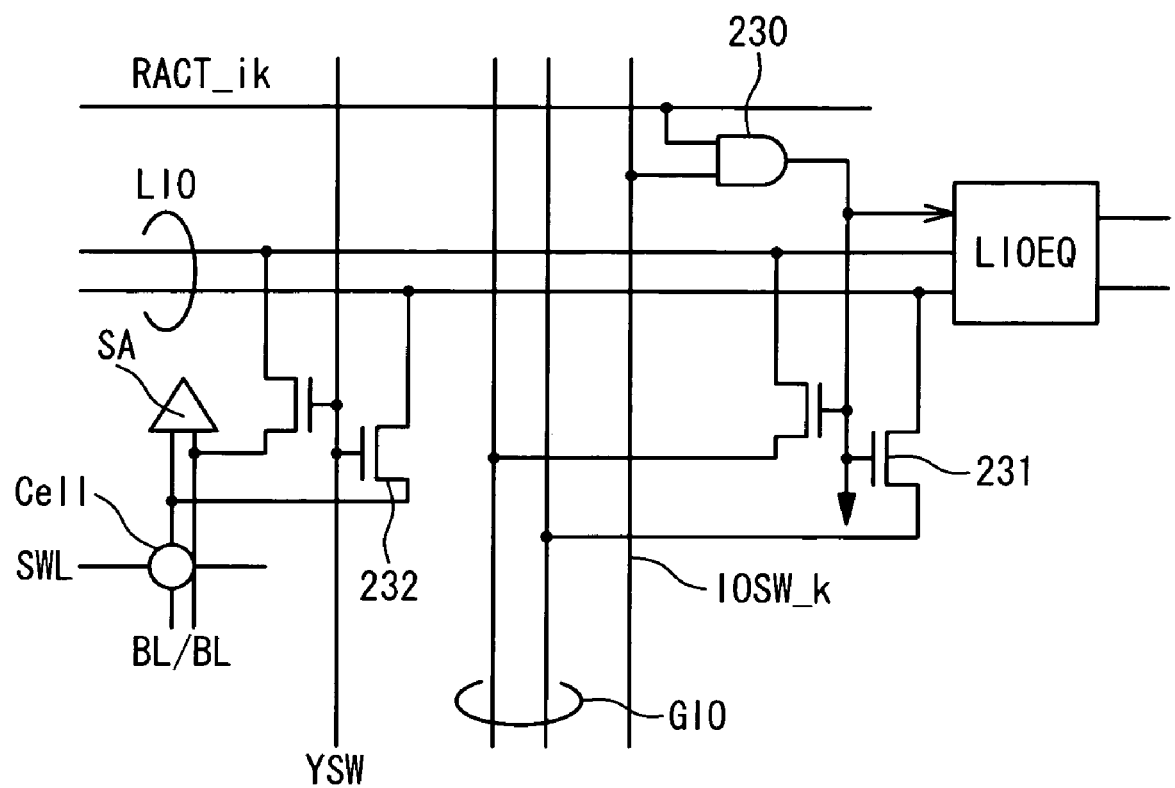
FIG. 1B is a circuit diagram partially illustrating an exemplary structure of sub-arrays within the conventional semiconductor memory device shown in FIG. 1A.
Figure 2:
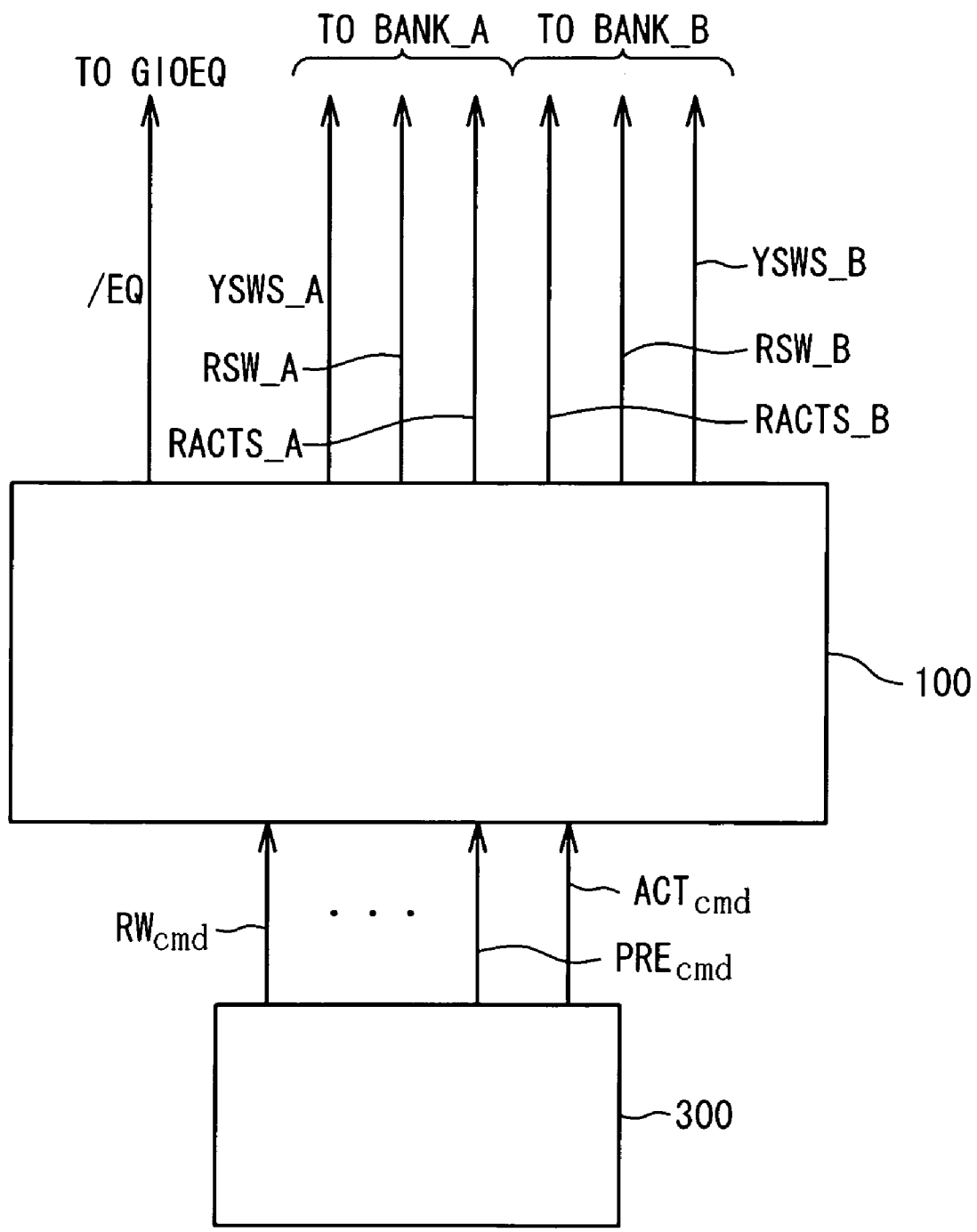
FIG. 2 is a block diagram partially illustrating the structure of the conventional semiconductor memory device.

In one embodiment, the present invention is applied to a synchronous semiconductor memory device, and one example is an SDRAM (Synchronous DRAM). In this embodiment, the structure of the semiconductor memory device is almost the same that of the semiconductor memory device shown in FIGS. 1A and 1B, having a plurality of banks A and B with the hierarchical I/O line architecture. A pair of local I/O lines LIO are provided along the X direction for each mat including a number of sub-arrays within each bank. Also, a number of pairs of global local I/O lines GIO are provided along the Y direction and shared by the banks A and B. Each pair of the global I/O lines GIO are connected to an equalizer circuit GIOEQ and an input/output amplifier DA/WA.

Figure 5:
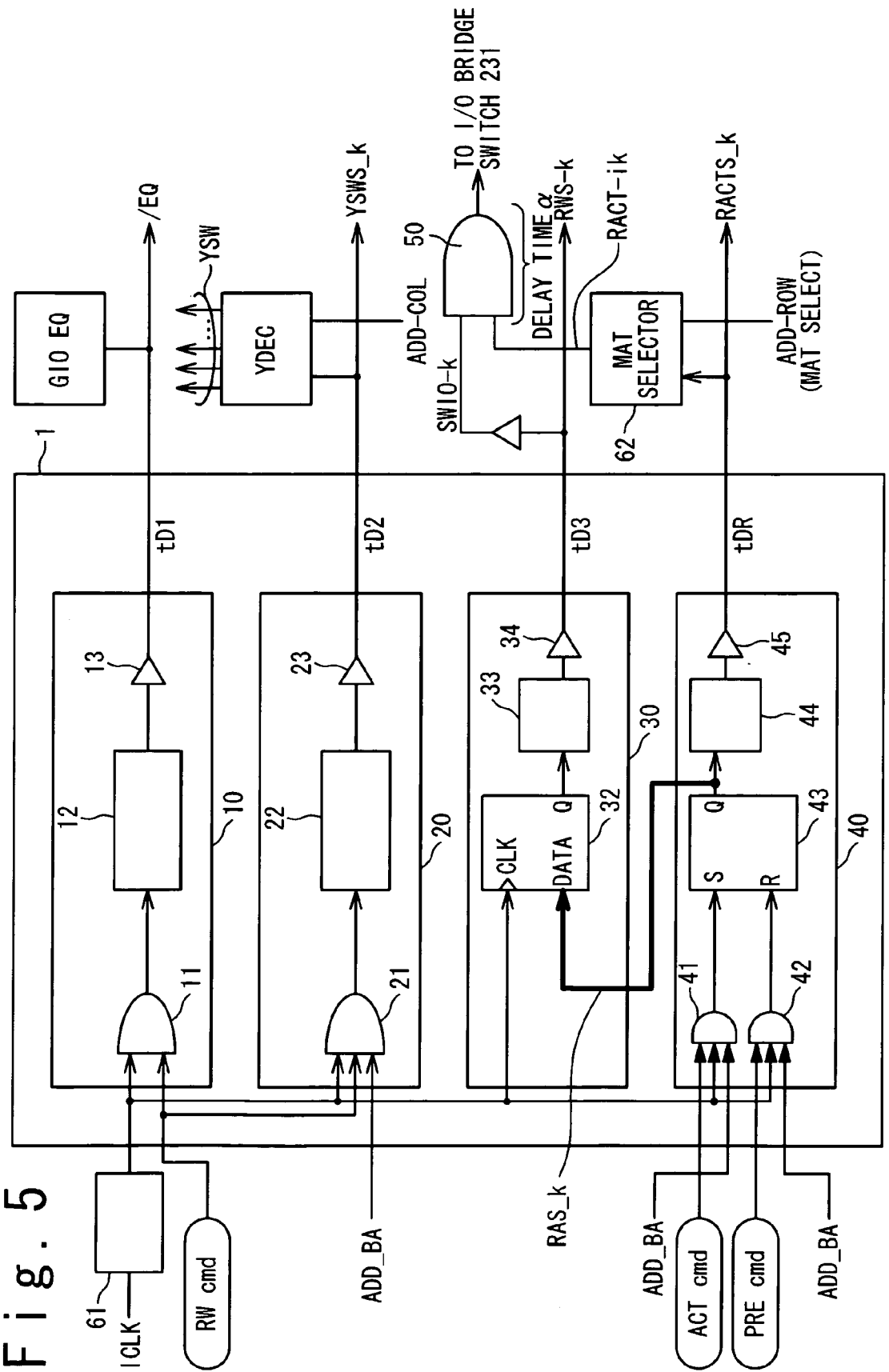
FIG. 5 is a block diagram illustrating an exemplary structure of a timing control circuit within a semiconductor memory device in a first embodiment of the present invention.

The connections between the local I/O lines LIO and the global I/O lines GIO are controlled by SWIO control circuits, which are denoted by the numeral 50 in FIG. 5. The SWIO control circuits 50 are each connected to a mat select signal line RACT_ik and an IO switch line IOSW_k. The mat select signal lines RACT_ik are each disposed along the X direction and provided for each mat; it should be noted that each mat is composed of a row of the plurality of sub-arrays SAR arranged in the X direction. On the other hand, the IO switch lines IOSW_k are disposed along the Y direction and provided for every a number of the columns of the sub-arrays SAR. In addition, the connections between the local I/O lines LIO and the bit lines BL and /BL are controlled by a set of column select signal lines YSW provided for every Y decoder. The column select signal lines YSW extend from Y decoders YDEC in the Y direction.

The difference of the semiconductor memory device in this embodiment from the conventional semiconductor memory device exists in the timing control of the mat select signal lines RACT_ik, the IO switch lines IOSW_k, the column select signal lines YSW_k and so forth. In this embodiment, structure and operation of a timing control circuit (row/column timing control circuit), denoted by numeral 1 in FIG. 5, are modified from those of the conventional timing control circuit 100. The timing control circuit 1 is designed to provide timing controls for the banks A and B, separately.

First Embodiment

FIG. 5 is a block diagram illustrating an exemplary structure of the timing control circuit 1 in a first embodiment of the present invention. The timing control circuit 1 receives an internal clock ICLK through a delay circuit 61. The timing of the received internal clock ICLK is adjusted by the delay circuit 61 so as to satisfy timing requirements, such as setup and hold times with respect to input data, including bank addresses. The timing control circuit 1 includes first to fourth logic circuits 10, 20, 30, and 40.

The first logic circuit 10 generates the GIO equalization timing signal /EQ in synchronization with the internal clock signal ICLK. Specifically, the first logic circuit 10 includes an AND gate 11, a delay circuit 12, and a buffer 13. The AND gate 11 receives the internal clock ICLK and the RWcmd signal on the inputs thereof, and outputs the results of the logical AND operation to the delay circuit 12. The output signal of the AND gate 11 is transferred to the equalizer circuits GIOEQ through the delay circuit 12 and the buffer 13, and used as the GI0 equalization timing signal /EQ. Here, the delay time of the GIO equalization timing signal /EQ is adjusted to "tD1" by the delay circuit 12. The equalizer circuits GIOEQ are required to equalize the global I/O lines GIO, while none of the column selection signal lines YSW are not selected, and also to stop equalizing the global I/O lines GIO so as not to corrupt data on the GIO when the desired column select signal line YSW is selected. The delay time tD1 of the GIO equalization timing signal /EQ is adjusted to satisfy such timing requirements.

The second logic circuit 20 generates the column select timing signals YSWS_A and YSWS_B in synchronization with the internal clock ICLK; it should be noted that FIG. 5 only illustrates the circuitry associated with one of the column select timing signals YSWS_A and YSWS_B, and the symbol "YSWS_k" collectively denotes the column select timing signals YSWS_A and YSWS_B. The second logic circuit 20 includes an AND gate 21, a delay circuit 22, and a buffer 23 for each of the column select timing signals YSWS_A and YSWS_B. The AND gate 21 receive the internal clock ICLK, the RWcmd signal, and the bank address selection signal ADD_BA, and outputs the result of the logic AND operation to the delay circuit 22. The output signal of the AND gate 21 is transferred to Y decoders YDEC through the delay circuit 22 and the buffer 23, and used as the column select timing signal YSWS_k. Here, the delay time of the column select timing signal YSWS_k is adjusted to "tD2" by the delay circuit 22. The Y decoders (YDEC) receive the column select timing signal YSWS_k and a column address signal ADD_COL for identifying the selected memory cell. to activate the corresponding column select signal line YSW. The delay time tD2 of the timing signal YSWS_k is adjusted so as to satisfy timing skew requirements with respect to the column address signal ADD_COL.

The third logic circuit 30 generates the column activation signals RWS_A and RWS_B; it should be noted that FIG. 5 only illustrates the circuitry associated with one of the column activation signal RWS_A and RWS_B, and the symbol "RWS_k" collectively denotes the column activation signal RWS_A and RWS_B.

Figure 3:
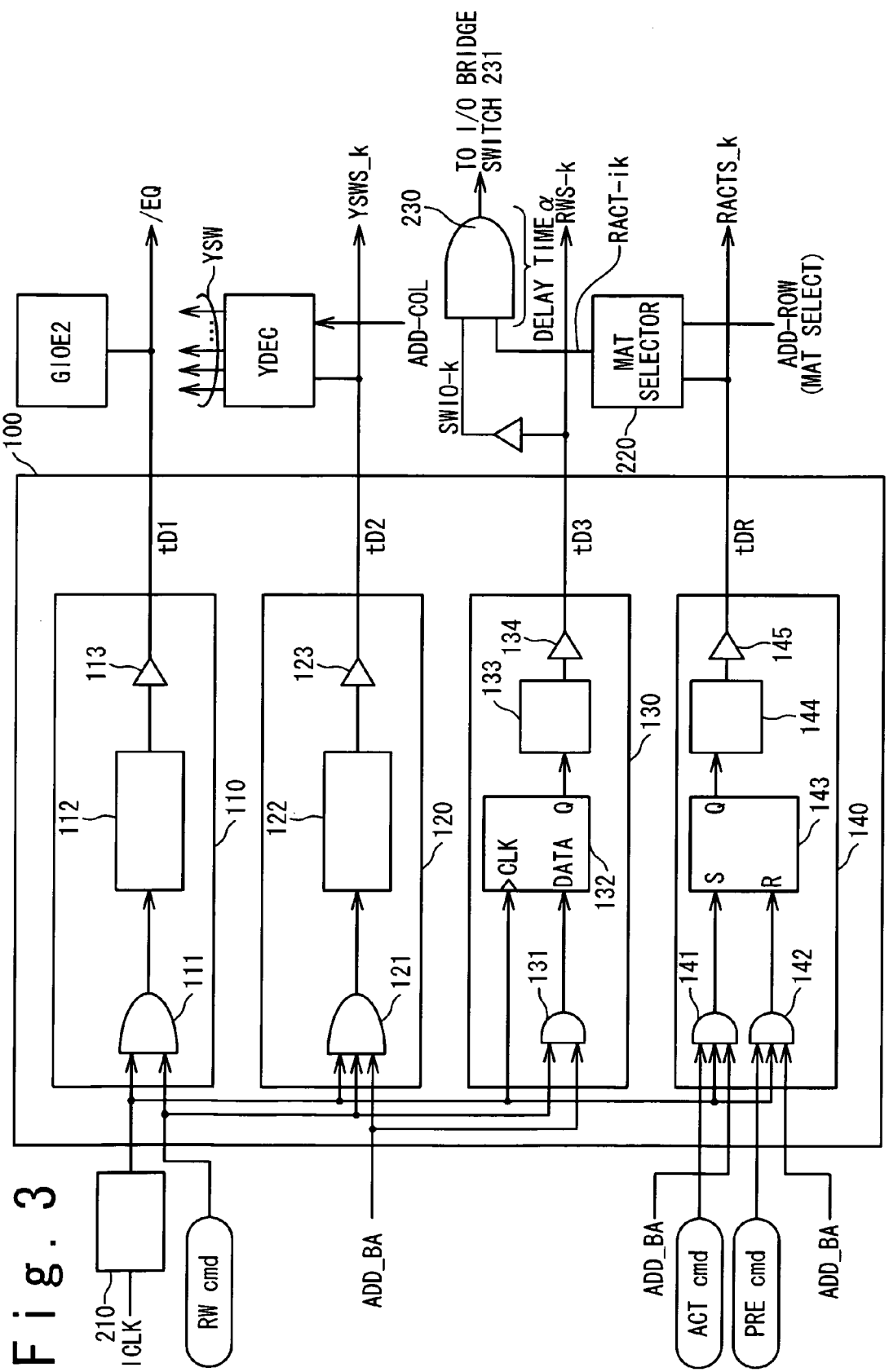
FIG. 3 is a block diagram illustrating an exemplary structure of a timing control circuit within the conventional semiconductor memory device shown in FIG. 1A.
Figure 4:
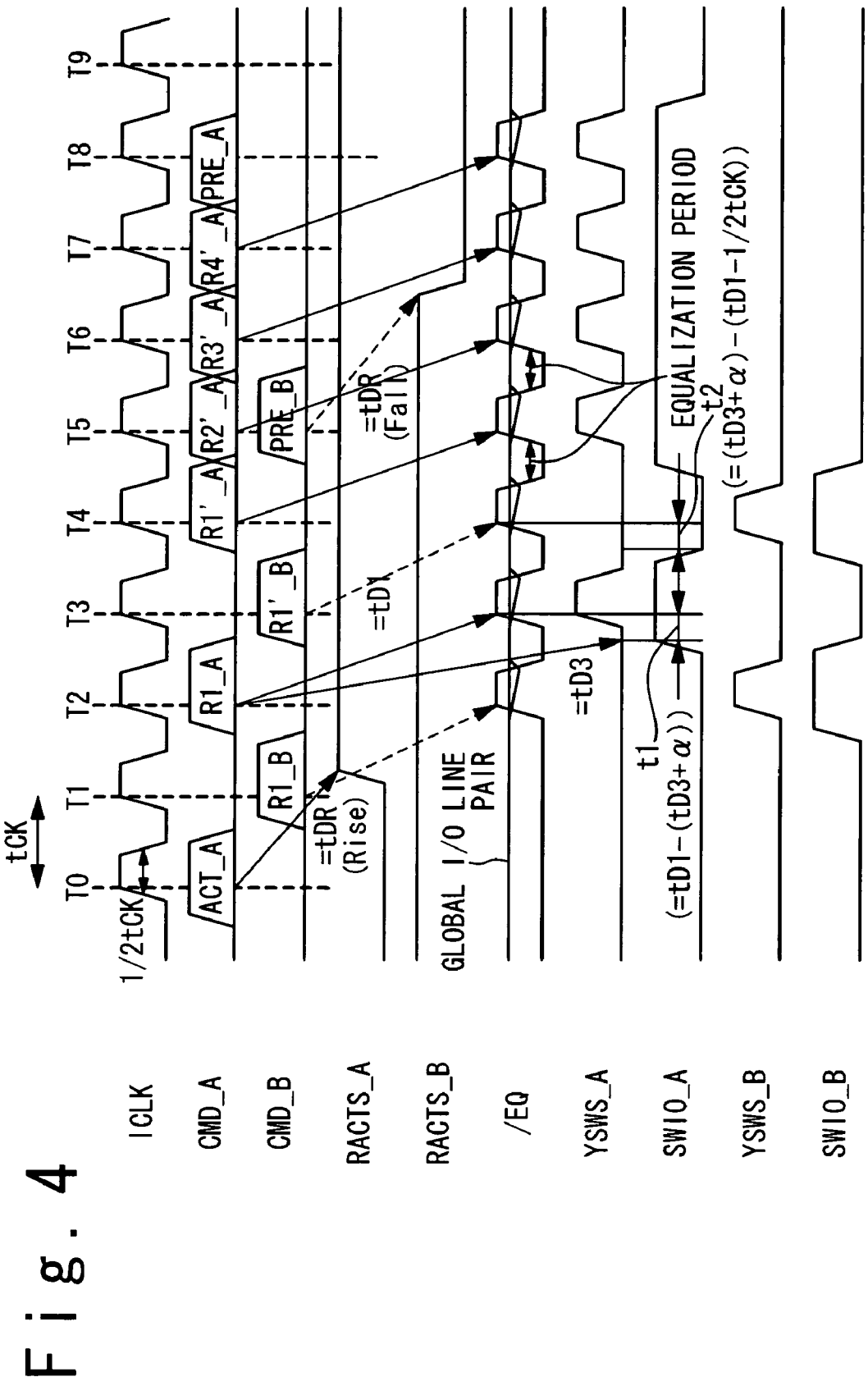
FIG. 4 is a timing chart illustrating an exemplary operation of the conventional semiconductor memory device.

The third logic circuit 30 within the timing control circuit 1 in this embodiment is configured differently from the third logic circuit 130 within the conventional timing control circuit 100 shown in FIG. 3. Specifically, as shown in FIG. 5, the third logic circuit 30 includes a D-flipflop 32, a delay circuit 33, and a buffer 34 for each of the column activation signal RWS_A and RWS_B. The D-flipflop 32 latches a row active signal RAS_k from the fourth logic circuit 40. The row active signal RAS_k indicates whether the associated bank is placed in the "row active state", which is a state in which the row address is already given to the relevant bank, and the bank is waiting for a read or write operation.

The D-flipflop 32 latches a row active signal RAS_k in response to the pull-down of the internal clock ICLK to the "Low" level (or upon the falling edge). The output signal of the D-flipflop 32 is outputted through the delay circuit 33 and the buffer 34, and used as the column activation signal RSW_k. The column activation signal RSW_k is transferred to buffers developing the I/O switch timing signals SWIO_k within each bank. The I/O switch timing signals SWIO_k are fed to the SWIO control circuits 50 that controls the I/O bridge switches 231 (See FIG. 1B). Referring back to FIG. 5, the delay time of the column activation signal RSW_k is adjusted to "tD3" by the delay circuit 33. The delay time tD3 is adjusted so as to switch the I/O switch timing signals SWIO_k while none of the column select signal lines YSW is selected.

The fourth logic circuit 40 generates the mat select timing signal RACTS_A and RACTS_B; it should be noted that FIG. 5 only illustrates the circuitry associated with one of the mat select timing signal RACTS_A and RACTS_B, and the symbol "RACTS_k" collectively denotes the mat select timing signal RACTS_A and RACTS_B. The fourth logic circuit 40 includes a pair of AND gates 41 and 42, an SR flipflop 43, a delay circuit 44, and a buffer 45 for each of the mat select timing signal RACTS_A and RACTS_B. The AND gate 41 receives the ACTcmd signal, the internal clock ICLK, and the bank address selection signal ADD_BA, and outputs the result of the logical AND operation to the S input of the SR flipflop 43. The AND gate 42 receives the PREcmd signal, the internal clock ICLK, and the bank address selection signal ADD_BA, and outputs the result of the logic AND operation to the R input of the SR flipflop 43. The SR flipflop 43 is set by the output of the AND gate 41, and reset by the output of the AND gate 42. The output signal of the flipflop 43 is used in two ways. Firstly, the output signal of the flipflop 43 is fed to the third logic circuit 30, and used as the row active signal RAS_k. The output signal of the flip-flop 43 is also outputted through the delay circuit 44 and the buffer 45, and used as the mat select timing signal RACTS_k. The mat select timing signal RACTS_k is fed to a mat selector circuit 62 associated therewith. Here, the delay time of the mat select timing signal RACTS_k is adjusted to "tDR" by the delay circuit 44. The mat selector circuit 62 receives the mat select timing signal RACTS_k and row address signals ADD_ROW to select the mat select signal lines RACT_ik. The delay time tDR of the mat select timing signal RACTS_k is adjusted so as to satisfy timing skew requirements with respect to the row address signals ADD_ROW, The SWIO control circuits 50 are each composed of an AND gate having two inputs connected to the associated mat select signal line RACT_ik and the associated IO switch line IOSW_k, respectively. The SWIO control circuits 50 each receive the associated IO switch timing signal SWIO_k from the third logic circuit 30, and also receive the mat select signal from the mat selector circuit 62. When the associated mat select signal line RACT_ik and IO switch line IOSW_k are both activated, the SWIO control circuits 50 activate the associated I/O bridge switches 231 to connect the global I/O lines GIO and the associated local I/O lines LIO. The local I/O lines LIO are connected to the associated bit lines BL and /BL in response to the activation of the column select timing signal YSWS_k outputted from the second logic circuit 20. Moreover, the global IO line pair is equalized in response to the activation of the GIO equalization timing signal /EQ outputted from the first logic circuit 10.

In this semiconductor memory device, "data refreshing" of a selected sub-array SAR is performed as follows. In response to an issue of an ACT command, the mat select timing signal RACTS_k (RACTS_A or RACTS_B) is activated to select the bank and mat associated with the selected sub-array SAR. This is followed by activating the associated main word line and sub-word lines SWL, and this results in that cell data stored on the memory cells associated with the selected sub-word line SWL is transferred to the associated bit lines BL and /BL. Each sense amplifier amplifies the voltage between the associated bit lines BL and /BL to identify the cell data, and the identified cell data are restored onto the associated memory cells Cell. The same goes for all the associated sub-word lines SWL. This is followed by an issue of a PRE command. In response to the PRE command, the relevant mat select timing signal RACTS_k is deactivated, and the main word line and the sub-word line SWL associated therewith are deactivated. After the memory cells are disconnected from the bit lines BL and /BL, the sense amplifiers SA are deactivated and the bit lines BL and /BL are equalized. This completes the data refreshing operation.

Data write operation into a selected memory cell within a selected sub-array SAR is performed as follows. In response to an issue of an ACT command, the mat select timing signal RACTS_k associated with the selected bank is activated, and the bank and mat associated with the selected sub-array SAR is selected and activated. In response to an issue of an RW command, write data is then transferred to the global I/O lines GIO via the input/output amplifier DA/WA. Desired one of the I/O switch timing signals SWIO_k is then activated in response the activation of the associated column activation signal RWS_k, and the local I/O lines LIO associated with the selected sub-array SAR is connected to the global I/O lines GIO. This is followed by connecting the bit lines BL and /BL associated with the selected memory cell with the associated local I/O lines LIO in response to the activation of the column select timing signal YSWS_k. As a result, the data on the global GIO is written into the selected memory cell through the local I/O lines LIO and the bit lines BL and /BL.

Data read operation from a selected memory cell within a selected sub-array SAR is performed as follows. In response to an issue of an ACT command, desired one of the mat select timing signals RACTS_A and RACTS_B is activated to select the bank and mat associated with the selected sub-array SAR. This is followed by activating the column activation signal RWS_k in response to an issue of an RW command, the desired IO switch timing signal SWIO_k is activated on the desired IO switch line IOSW_k. This results in that the local I/O lines LIO associated with the selected sub-array SAR is connected to the global I/O lines GIO. This is followed by connecting the bit lines BL and /BL associated with the selected memory cell with the local I/O lines LIO in response to the activation of the associated column select timing signal YSWS_k. As a result, the data stored in the selected memory cell is read to the local I/O lines LIO through the bit lines BL and /BL, and is transferred to the input/output amplifier DA/WA via the global I/O lines GIO.

One feature of the semiconductor memory device in this embodiment is that the switching of the I/O switch signals SWIO_A and SWIO_B is synchronous with the ACT command and the PRE command, instead of the read commands. The I/O switch signals SWIO_A and SWIO_B are activated in response to the banks A and B being placed into the "row active state", respectively, and deactivated in response to the banks A and B getting out of the "row active state", respectively. In other words, the switching of the I/O switch signals SWIO_A and SWIO_B is synchronous with RAS cycles, instead of CAS cycles. Such operation effectively reduces a number of times of switching of the I/O switch signals SWIO_A and SWIO_B, and thereby reduces the operating current of the semiconductor memory device.

Figure 6:
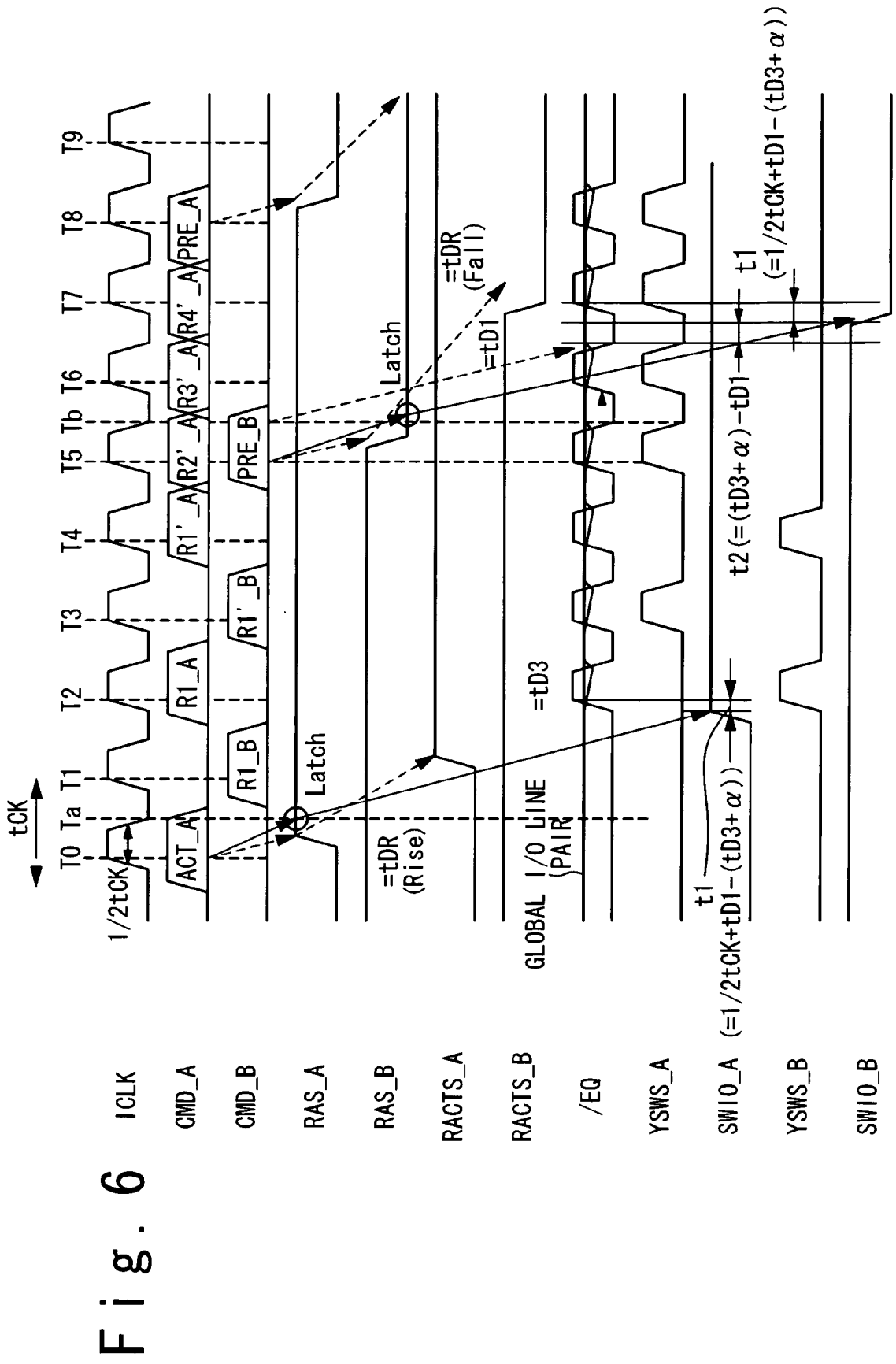
FIG. 6 is a timing chart illustrating an exemplary operation of the semiconductor memory device shown in FIG. 5.

FIG. 6 is a timing chart showing an exemplary operation of the semiconductor memory device in this embodiment. In this operation, the burst length is set to 4. Additionally, the duration of the cycle of the internal clock ICLK is denoted by the symbol tCK and the duty ratio thereof is set to 50%. Moreover, read operations of the banks A and B are alternatively (or interleavedly) performed.

Initially, the bank A is deactivated, and the bank B is activated. That is, the row active signal RAS_B, the mat select timing signal RACTS_B and I/O switch timing signal SWIO_B for the bank B are activated and set to the "High" level. Accordingly, the global I/O lines GIO are connected to selected local I/O lines LIO within the bank B (LIO_B). On the contrary, the row active signal RAS_A, the mat select timing signal RACTS_A, and the I/O switch timing signal SWIO_A for the bank A are deactivated. Accordingly, the global I/O lines GIO are not connected to any of the local I/O lines LIO within the bank A (LIO_A).

A read operation of the bank A begins with an issue of an ACT_A command for activating the bank A, activating the ACTcmd signal associated with the bank A. In response to the activation of the ACTcmd signal associated with the bank A, the SR flipflop 43 is set at a time T0. This results in that the row active signal RAS_A is activated and the mat select timing signal RACTS_A is also activated after a lapse of the delay time tDR(Rise) from time T0.

At a time Ta within the same clock cycle, the internal clock ICLK is pulled down to the "Low" level. In response to the falling edge of this clock cycle, the D-flipflop 32 latches the row active signal RAS_A. This results in that column active signal RWS_A is activated and the associated I/O switch timing signals SWIO_A are also activated accordingly. In response to the activation of the I/O switch timing signals SWIO_A, the global I/O lines GIO are connected with selected local I/O lines LIO within the bank A. As described above, the I/O switch timing signals SWIO_A are activated in response to the bank A being placed into the "row active state", in this embodiment.

At a time T1 within the next clock cycle, a read command R1_B is issued. In response to the read command R1_B, the first logic circuit 10 deactivates the GIO equalization timing signal /EQ after a lapse of the delay time tD1 from the time T1, and the second logic circuit 20 activates the column select timing signal YSWS_B after a lapse of the delay time tD2 from the time T1. In response to the deactivation of the GIO equalization timing signal /EQ, the equalizer circuits GIOEQ stop equalization of the global I/O lines GIO. Additionally, in response to the activation of the column select timing signal YSWS_B, the selected local I/O lines LIO_B are connected with the selected bit lines BL and /BL within the bank B. This allows the data read by the sense amplifier SA_B associated with the selected bit lines BL and /BL is transferred to the global I/O lines GIO via the selected local I/O lines LIO_B within the bank B.

It should be noted that tLhe global I/O lines GIO are connected with local I/O lines LIO_A selected immediately before, since the I/O switch timing signal SWIO_A remains activated. Nevertheless, this does not affect the read operation of the bank B, and the read operation of the bank B is completed normally. This is because all the column select signals YSW_A are deactivated, and only the column select signal YSW_B associated with the selected memory cell is activated.

At a time T2 within the next clock cycle, a read command R1_A is issued. In response to the read command R1_A, the first logic circuit 10 deactivates the GIO equalization timing signal /EQ after a lapse of the delay time tD1 from the time T2, and the second logic circuit 20 activates the column select timing signal YSWS_A after a lapse of the delay time tD2 from the time T2. In response to the deactivation of the GIO equalization timing signal /EQ, the equalizer circuits GIOEQ stop equalization of the global I/O lines GIO. Additionally, in response to the activation of the column select timing signal YSWS_A, the selected local I/O lines LIO_A are connected with the selected bit lines BL and /BL within the bank A. This allows the data read by the sense amplifier SA_A associated with the selected bit lines BL and /BL is transferred to the global I/O lines GIO via the selected local I/O lines LIO_A within the bank A.

It should be noted at that the global I/O lines GIO are connected with local I/O lines LIO_B selected immediately before, since the I/O switch timing signal SWIO_B remains activated. Nevertheless, this does not affect the read operation of the bank A, and the read operation of the bank A is completed normally. This is because all the column select signals YSW_B are deactivated, and only the column select signal YSW_A associated with the selected memory cell is activated.

At a time T3 within the next clock cycle, a read command R1'_B is issued for the bank B, and the read operation of the bank B is performed. This is followed by issuing a read command R1'_A for the bank A at a time T4 within the next clock cycle, the read command R1'_A indicating initiation of the burst read operation of the bank A. In response to the read command R1'_A, the first burst cycle of the burst read operation of the bank A is performed. It should be noted that the switching of the I/O switch timing signals SWIO_A and SWIO B is not carried out during these clock cycles, neither.

At a time T5 within the next cycle, a PRE_B command is issued to deactivate the bank B, and the PREcmd signal associated with the bank B is activated. In response to the activation of the PREcmd signal associated with the bank B, the SR-flipflop 43 is reset, and the row active signal RAS_B is deactivated. Tn addition, the MAT selection timing signal RACTS_B is deactivated after a lapse of the delay time tDR(Fall) from the time T5.

At a time Tb within the same cycle, the internal clock ICLK is pulled down to the "Low" level. In response to the falling edge of the internal clock ICLK, the D-flipflop 32 latches the row active signal RAS_B deactivated. This results in that column active signal RWS B is deactivated, and the associated I/O switch timing signals SWIO_B are also deactivated after a lapse of the delay time tD3 from the time Tb. In response to the deactivation of the I/O switch timing signals SWIO_B, the global I/O lines GIO are disconnected from the local I/O lines LIO_B within the bank B. As described above, the I/O switch timing signals SWIO_B are deactivated in response to the bank B being placed into the "row active state", in this embodiment.

During this clock cycle, the second burst cycle of the burst read operation is performed for the bank A. Specifically, the GIO equalization timing signal /EQ is deactivated after a lapse of the delay time tD1 from the time T5, and then activated after a lapse of the delay time tD1 from the time Tb. In addition, the column select timing signal 1 YSWS_A is activated after a lapse of the delay time tD2 from the time T5, and then deactivated after a lapse of the delay time tD2 from the time Tb.

Subsequently, third and fourth burst cycles of the burst read operation are performed for the bank A at times T6 and T7, respectively.

At a time T8, a PRE_A command is issued to deactivate the bank A, and the bank A is also deactivated after a lapse of the delay time tDR(Fall) from the time T8. Also, the global I/O lines GIO are disconnected from the local I/O lines LIO_A.

In order to implement the above stated operations, the delay times tD1 to tD3 are set so as to satisfy requirements described below. Firstly, it is necessary to stop the equalization of the global I/O lines GIO so as not to corrupt the data on the global I/O lines GIO, when any of the column select signal lines YSW is activated. For this purpose, the delay time tD1 of the equalization timing signal /EQ is determined as being identical to the delay time tD2 of the column select timing signals YSWS_A and YSWS_B.

Additionally, in order to prevent the global I/O lines GIO from being affected by noise due to the switching of the I/O switch timing signals SWIO_A and SWIO_B, the delay time tD3 of the column activation signals RWS_A and RWS_B is determined so that the I/O switch timing signals SWIO_A and SWIO_B are switched while none of the column select signal lines YSW is selected. That is, all the column select signal lines YSW are deselected after a lapse of the delay time tD2 from the rising edge of the internal clock ICLK, and the equalization of the global I/O lines GIO is started at almost the same timing (that is, after a lapse of the delay time tD1). This is followed by deactivating the I/O switch timing signals SWIO_A or SWIO_B. Consequently, the delay time tD3 of the I/O switch timing signals SWIO_A or SWIO_B (or of the column activation signals RSW_A and RWS_B) is set so as to satisfy the following equation:

$$tD1 < tD3 + \alpha < tD1 + \tfrac{1}{2}tCK, \quad (4)$$

where α denotes a delay time in the SWIO control circuits 50, and tCK denotes the duration of the cycle of the internal clock ICLK. From equation (4), the following equations (5) and (6) can be obtained, which express a margin t1 between the activation timings of the I/O switch signals SWIO_A and SWIO_B and the column select timing signals YSWS_A and YSWS_B, and a margin t2 between the deactivation timings of the I/O switch signals SWIO_A and SWIO_B and the column select timing signals YSWS_A and YSWS_B:

$$t1 = (tD1 + \tfrac{1}{2}tCK) - (tD3 + \alpha), \quad (5)$$

$$t2 = (tD3 + \alpha) - tD1. \quad (6)$$

One advantageous feature of the semiconductor memory device in this embodiment is the reduction of the operating current. As stated above, the I/O switch timing signals SWIO_A and SWIO_B are developed in response to the row active signals RAS_A and RAS_B; in other words, the I/O switch timing signals SWIO_A and SWIO_B are activated in response to the issue of the ACT command, and deactivated in response to the issue of the PRE command. That is, the I/O switch timing signals SWIO_A and SWIO_B are activated and deactivated in synchronization with row cycles or RAS cycles. This effectively reduces the number of times of switching of the I/O switch timing signals SWIO_A and SWIO_B, and thereby reduces the operating current of the semiconductor memory device, as compared with the case where the I/O switch timing signals SWIO_A and SWIO_B are switched in synchronization with column cycles.

For example, according to the specifications for a commonly-used SDRAM, the RAS cycle time (tRC) is 67.5 ns and the column cycle time (tCC) is 7.5 ns. In this case, the memory device architecture in this embodiment reduces the operating current relevant to the I/O switch timing signals SWIO_A and SWIO_B down to about 22.2% (=2×tCC/tRC). The memory device architecture presented in this embodiment will be more effective in future, since an increasing number of IO switch lines IOSW will be incorporated within the memory device to satisfy recent requirements for an increased data bit width.

One advantageous feature of the semiconductor memory device in this embodiment is the improved stability in high-speed (or high-frequency) operation. In the semiconductor memory device in this embodiment, the D-flipflop 32 latches the row active signal RAS upon the rising edge of the internal clock ICLK. Thus, the margins t1 and t2 are expressed in the above described equations (5) and (6), respectively. By setting the delay times tD1 and tD3 in such a manner that tD3+α=tD1, it is possible to provide the margin t1 of "½ tCKmin" and the margin t2 of "0". This achieves stabilized high-speed (high-frequency) operation of the semiconductor memory device.

It should be noted that the memory device architecture thus presented provides the margin t1 of "½ tCKmin−α" even if the delay time tD1 is reduced to approximately zero due to advances in circuit and processing technologies. This enhances the stability of the high-speed and high-frequency operation, Preferably, the delay times tD1 and tD3 are set to the same value to provide the same delay time for the I/O switch timing signals SWIO_A and SWIO_B and the column select timing signals YSWS_B. This effectively achieves stable operation free from process variations and power supply voltage fluctuation.

In this embodiment, the row active signals RAS_A and RAS_B are latched to develop the I/O switch timing signal SWIO_A and SWIO_B in response to the pull down nf the internal clock ICLK to the "Low" level. This is because the column select timing signals YSWS_A and YSWS_B are deactivated in response to the pull-down of the internal clock ICLK. Therefore, the above effect may be also obtained by latching the RAS-related signals such as row active signals RAS_A and RAS_B to generate the I/O switch timing signals SWIO_A and SWIO_B, in response to the pull-down of the column select timing signals YSWS_A and YSWS_B.

(Alternative Architecture)

In the above-described embodiment, the I/O switch timing signals SWIO_A and SWIO_B are activated and deactivated synchronously with falling edges of the internal clock ICLK, and the mat select timing signals RACTS_A and RACTS_B are activated and deactivated synchronously with rising edges of the internal clock ICLK. This may cause inappropriate timing control when the duty ratio of the internal clock ICLK is fluctuated.

Specifically, a duration of a time tD4 (which is defined as being the delay time tD3 plus the duration of the "High" period during which the internal clock ICLK is set to the "High" level within each clock cycle) may be longer than the delay time tDR (Fall) when the duty ratio of the internal clock ICLK (that is, the duration of the "High" period) is too large. In this case case, the local I/O lines LIO are disconnected from the global I/O lines GIO in response to the mat selection signals RACTS_A and RACT_B in stead of the I/O switch timing signals SWIO_A and SWIO_B. This undesirably causes a malfunction in which connections between the local I/O lines LIO and the global I/O lines GIO are switched while the selected column select timing signal YSW is activated.

In order avoid this, the timing control circuit 1 may further include an OR gate receiving output signals from the third and second logic circuits 30 and 40 for each of the banks A and B. In this case, the output signals of the OR gates are used as the selection signal timing signal RACTS_A and RACT_B.

Figure 7:
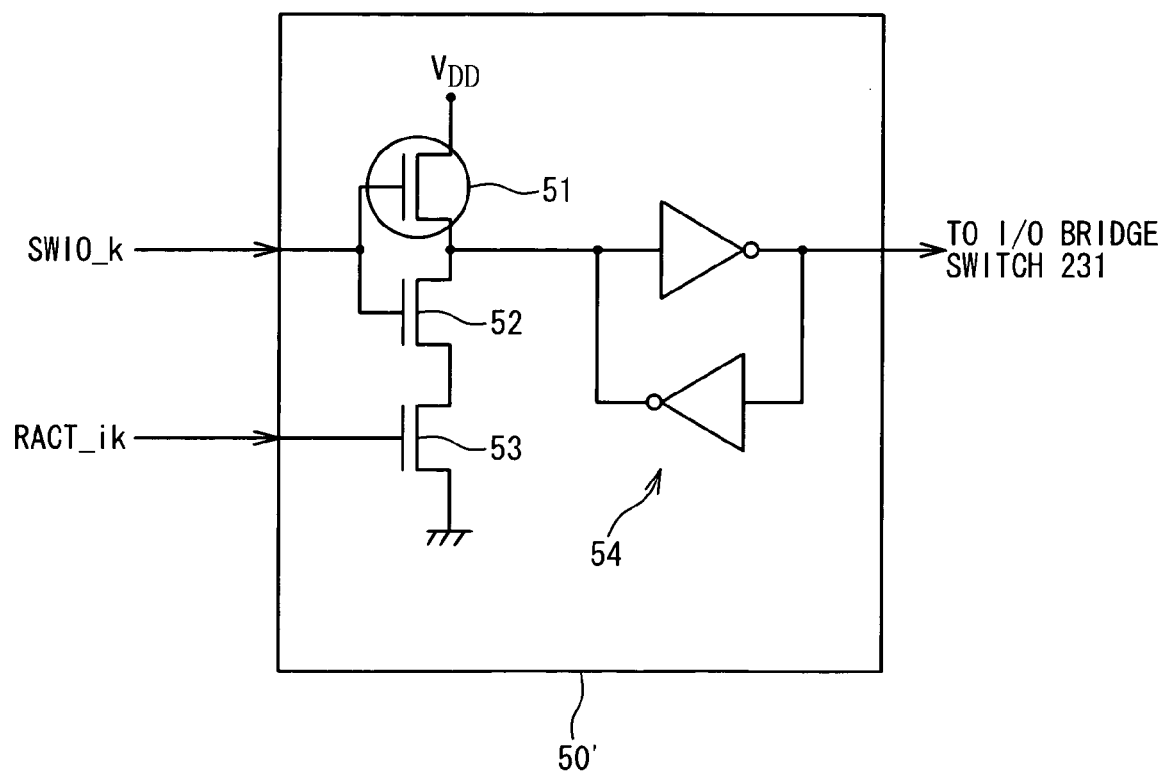
FIG. 7 is a diagram illustrating a preferred structure of an SWIO control circuit within the semiconductor memory device in the first embodiment.

Moreover, SWIO control circuits 50' shown in FIG. 7 may be used instead of the SWIO control circuits 50 (which are each composed of an AND gate) shown in FIG. 5. The SWIO control circuits 50' each include a PMOS transistor 51, NMOS transistors 52 and 53, and a latch circuit 54. The PMOS transistor 51 has a source connected to a power supply terminal VDD and a drain connected to a drain of the NMOS transistor 52. The PMOS transistor 51 receives the I/O switch timing signal SWIO_k (SWIO_A or SWIO_B) on the gate thereof. The NMOS transistor 52 has a source connected to a drain of the NMOS transistor 53, and receives the I/O switch timing signal SWIO_k on the gate thereof. The NMOS transistor 53 has a source connected to the earth terminal, and receives the mat selection signal RACT_ik on the gate thereof. The latch circuit 54 is connected to the drains of the PMOS transistor 51 and the NMOS transistor 52.

The SWIO control circuits 50' thus constructed activate the associated I/O bridge circuits 231 to establish connections between the associated local I/O lines LIO and the global I/O lines GIO, in response to the activation of both of the associated I/O switch timing signal SWIO_k and mat select signal developed on the mat select line RACT_ik. On the other hand, the SWIO control circuits 50' deactivate the associated I/O bridge circuits 231 to disconnect the associated local I/O lines LIO from the global I/O lines GIO, in response to the deactivation of the associated I/O switch timing signal SWIO_k regardless of the state of the associated mat select signal developed on the mat select line RACT_ik. Such operation allows controlling the connections between the local I/O lines LIO and the global I/O lines GIO in response to the I/O switch timing signals SWIO_A and SWIO_B, so that the connections between the local I/O lines LIO and the global I/O lines GIO are switched only while all the column select timing signals YSW are deactivated "Low".

It should be noted, however, the above-described problem relevant to the time tD4 is not so serious; the time tD4 is shorter than the delay time tDR in most cases, because the mat select timing signals RACTS_A and RACTS_B are deactivated after the sub-word lines SWD are deactivated when the sub-arrays SAR are deactivated.

Second Embodiment

Figure 8:
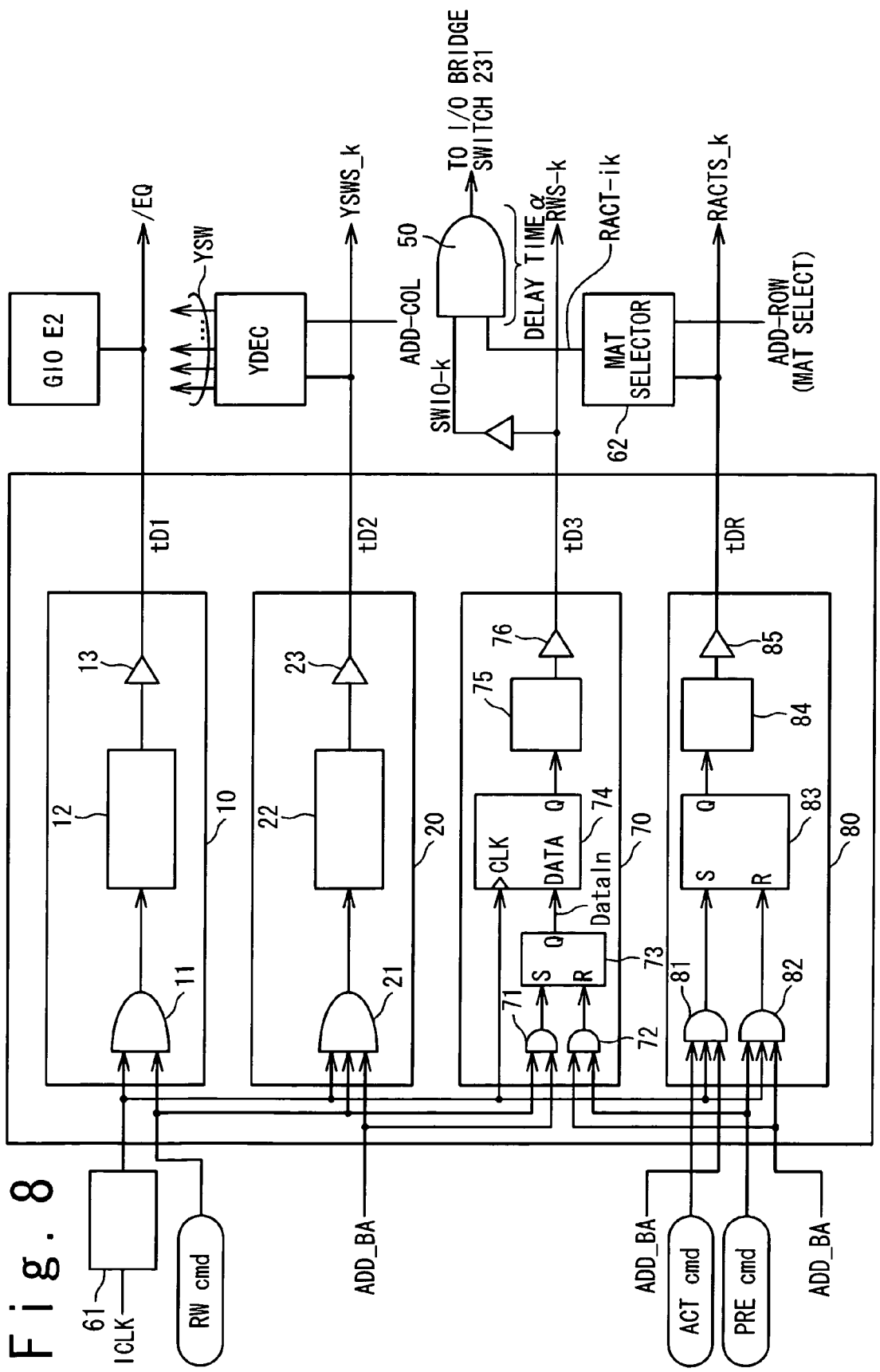
FIG. 8 is a block diagram illustrating an exemplary structure of a timing control circuit within a semiconductor memory device in a second embodiment of the present invention.

FIG. 8 is a block diagram showing a structure of a timing control circuit 1' in a second embodiment of the present invention. The timing control circuit 1' includes the first logic circuit 10, the second logic circuit 20, a third logic circuit 70, and a fourth logic circuit 80. It should be noted that the same elements are denoted by the same numerals in FIGS. 5 and 8. The third and fourth logic circuits 70 and 80 within the timing control circuit 1' are different in the structure and operation from the third and fourth logic circuits 30 and 40 within the timing control circuit 1 shown in FIG. 5.

The third logic circuit 70 generates the column activation signals RWS_A and RWS B; it should be noted that FIG. 8 only illustrates the circuitry associated with one of the column activation signal RWS_A and RWS_B, and the symbol "RWS_k" collectively denotes the column activation signal RWS_A and RWS_B. The third logic circuit 130 includes a pair of AND gates 71 and 72, a SR flipflop 73, a D-flipflop 74, a delay circuit 75, and a buffer 76 for each of the column activation signal RWS_A and RWS_B. The AND gate 71 receives the RWcmd signal and the bank address selection signal ADD_BA, and outputs the result of the logic AND operation to the S input of the SR flipflop 73. The AND gate 72 receives the PREcmd signal and the bank address selection signal ADD_BA, and outputs the result of the logic AND operation to the R input of the SR flipflop 73. The SR flipflop 73 is set in response to the output signal of the AND gate 71, and reset in response to the output signal of the AND gate 72. The data outputted from the SR flipflop 73, denoted by input data DataIN, is fed to the data-input of the D-flipflop 74. It should be noted that the D-flipflop 74 latches the input data DataIN upon rising edges of the internal clock ICLK, differently from the D-flipflop 32 within the third logic circuit 30 in the first embodiment. The output signal of the D-flipflop 74 is outputted through the delay circuit 75 and the buffer 76, and used as the column activation signal RWS_k. The column activation signal RSW_k is transferred to buffers developing the I/O switch timing signals SWIO_k within each bank, and the I/O switch timing signals SWIO_k are fed to the SWIO control circuits 50. Here, the delay time of the column activation signal RSW_k is adjusted to "tD3" by the delay circuit 75. The delay time tD3 is adjusted so as to switch the I/O switch timing signals SWIO_k while none of the column select signal lines YSW is selected.

The fourth logic circuit 80 generates the mat select timing signal RACTS_A and RACTS_B; it should be noted that FIG. 8 only illustrates the circuitry associated with one of the mat select timing signal RACTS_A and RACTS_B, and the symbol "RACTS_k" collectively denotes the mat select timing signal RACTS_A and RACTS_B. The fourth logic circuit 80 includes a pair of AND gates 81 and 82, an SR flipflop 83, a delay circuit 84, and a buffer 85 for each of the mat select timing signal RACTS_A and RACTS_B. The AND gate 81 receives the ACTcmd signal, the internal clock ICLK, and the bank address selection signal ADD_BA, and outputs the result of the logic AND operation to the S input of the SR flipflop 83. The AND gate 82 receives the PREcmd signal, the internal clock ICLK, and the bank address selection signal ADD_BA, and outputs the result of the logic operation to the R input of the SR flipflop 83. The SR flipflop 83 is set by the output of the AND gate 81, and reset by the output of the AND gate 82. The output signal of the SR flipflop 83 is outputted through the delay circuit 84 and the buffer 85, and used as the mat select timing signal RACTS_k. The mat select timing signal RACTS_k is fed to the mat selector circuit 62. Here, the delay time of the mat select timing signal RACTS_k is adjusted to "tDR" by the delay circuit 144. The mat selector circuit 62 receives the mat select timing signal RACTS_k and row address signals ADD_ROW to select the mat select signal lines RACT_ik. The delay time tDR of the mat select timing signal RACTS_k is adjusted so as to satisfy timing skew requirements with respect to the row address signals ADD_ROW.

Figure 9:
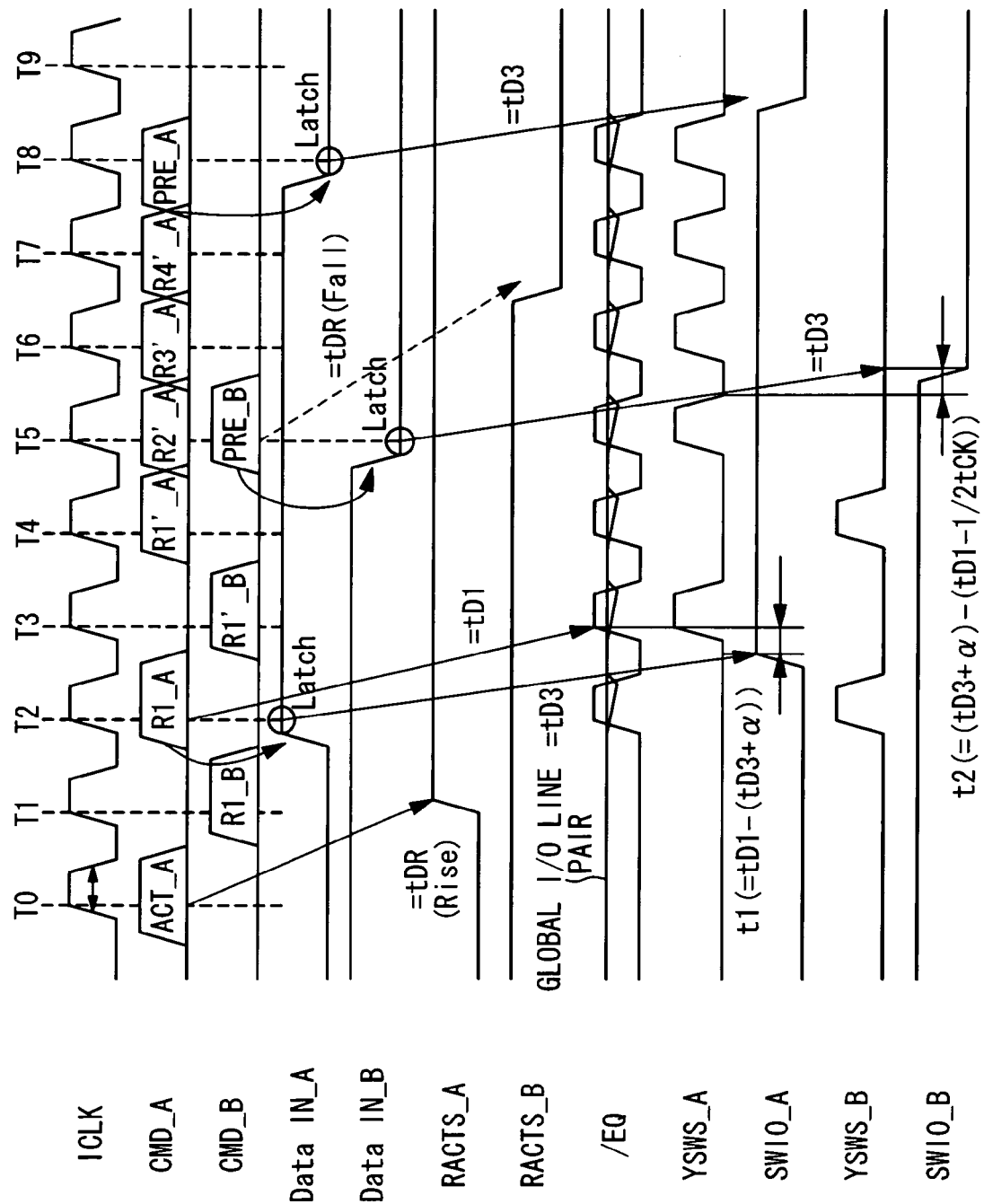
FIG. 9 is a timing chart illustrating an exemplary operation of the semiconductor memory device in the second embodiment of the present invention.

FIG. 9 is a timing chart showing an exemplary operation of the semiconductor memory device in the second embodiment. In this operation, the burst length is set to 4. Additionally, the duration of the cycle of the internal clock ICLK is denoted by the symbol tCK and the duty ratio thereof is set to 50%. Moreover, read operations of the banks A and B are alternatively (or interleavedly) performed.

Initially, the bank A is deactivated, and the bank B is activated. That is, the row active signal RAS_B, the mat select timing signal RACTS_B, and I/O switch timing signal SWIO_B for the bank B are activated and set to the "High" level, and the input data DataIn_B, which is inputted to the D-flipflop 74 associated with the bank B, is set to logic "1". Accordingly, the global I/O lines GIO are connected to selected local I/O lines LIO within the bank B (LIO_B). On the contrary the row active signal RAS_A, the mat select timing signal RACTS_A, and the I/O switch timing signal SWIO_A for the bank A are deactivated, and the input data DataIn_A, which is inputted to the D-flipflop 74 associated with the bank A, is set to logic "0". Accordingly, the global I/O lines GIO are not connected to any of the local I/O lines LIO within the bank A (LIO_A).

A read operation of the bank A begins with an issue of an ACT_A command for activating the bank A, activating the ACTcmd signal associated with the bank A. In response to the activation of the ACTcmd signal associated with the bank A, the SR flipflop 83 is set at a time T0. This results in that the mat select timing signal RACTS_A is activated after a lapse of the delay time tDR(Rise) front time T0.

At a time T1 within the next clock cycle, a read command R1_B is issued. In response to the read command R1_B, the GIO equalization timing signal /EQ is deactivated after a lapse of the delay time tD1 from the time T1, the column select timing signal YSWS_B is activated after a lapse of the delay time tD2 from the time T1. In response to the deactivation of the GIO equalization timing signal /EQ, the equalizer circuits GIOEQ stop equalization of the global I/O lines GIO. Additionally, in response to the activation of the column select timing signal YSWS_B, the selected loral I/O lines LIO B are connected with the selected bit lines BL and /BL within the bank B. This allows the data read by the sense amplifier SA_B associated with the selected bit lines BL and /BL is transferred to the global I/O lines GIO via the selected local I/O lines LIO B within the bank B.

At a time T2 within the next clock cycle, a read command R1_A is issued, which is the read command first issued after the activation of the bank A. In response to the read command R1_A, the input data DataIn_A is set to logic "1", and then latched by the D-flipflop 74 upon the rising edge of the internal clock ICLK at the time T2. This results in that the I/O switch timing signal SWIO_A is activated after a lapse of the delay time tD3 from the time T2.

In the meantime, the GIO equalization timing signal /EQ is deactivated after a lapse of the delay time tD1 from the time T2, and the second logic circuit 20 activates the column select timing signal YSWS_A after a lapse of the delay time tD2 from the time T2. In response to the deactivation of the GIO equalization timing signal /EQ, the equalizer circuits GIOEQ stop equalization of the global I/O lines GIO. Additionally, in response to the activation of the column select timing signal YSWS_A, the selected local I/O lines LIO_A are connected with the selected bit lines BL and /BL within the bank A. This allows the data read by the sense amplifier SA_A associated with the selected bit lines BL and /BL is transferred to the global I/O lines GIO via the selected local I/O lines LIO_A within the bank A.

It should be noted that the global I/O lines GIO are connected with local I/O lines LIO_B selected immediately before, since the I/O switch timing signal SWIO_B remains activated. Nevertheless, this does not affect the read operation of the bank A, and the read operation of the bank A is completed normally. This is because all the column select signals YSW_B are deactivated, and only the column select signal YSW_A associated with the selected memory cell is activated.

Subsequently, a read command R1'_B is issued for the bank B at a time T3 within the next clock cycle, and a read command R1'_A is then issued for the bank A at a time T4 within the next clock cycle. It should be noted that the read command R1'_A for the bank A indicates to initiate a burst read operation of the bank A. In response to the successive issues of the read commands R1'_B and R1'_A, the read operation of the bank B is performed, and then the first burst cycle of the burst read operation of the bank A is performed. It should be noted that the I/O switch timing signals SWIO_A and SWIO_B are not switched during these clock cycles.

At a time T5 within the next cycle, a PRE_B command is issued to deactivate the bank B, and the PREcmd signal associated with the bank B is activated. In response to the activation of the PREcmd signal associated with the bank B, the input data DataIn_B is set to logic "0". The input data DataIn_B is then latched by the D-flipflop 74 upon the rising edge of the internal clock ICLK at the time T5. Accordingly, the I/O switch timing signal SWIO_B is deactivated after a lapse of the delay time tDR (Fall) from the time T5, and the global I/O lines GIO are disconnected from the local I/O lines LIO_B within the bank B. It should be noted that, in this embodiment, the I/O switch timing signal SWIO_B is deactivated in response to the bank B getting out of the "row active state" upon the issue of the PRE_B command for the bank B.

The PREcmd signal associated with the bank B is also latched by the flip-flop 83 at the time T5. In response to the activation of the PREcmd signal associated with the bank B, the mat select timing signal RACTS_B is deactivated after a lapse of the delay time tDR(Fall) from the time T5.

In the meantime, a second burst cycle of the burst read operation is performed with respect to the bank A in this cycle.

Subsequently, third and fourth burst cycles of the burst read operation are performed with respect to the bank A at times T6 and T7, respectively. At a time TB, a PRE_A command is issued for the bank A to deactivate the bank A, and, the bank A is also deactivated after a lapse of the delay time tDR(Fall) from the time TB. In addition, the I/O switch timing signal SWIO_A is deactivated after a lapse of the delay time tD3 from the time T8 to disconnect the global I/O lines GIO from the local I/O lines LIO_A within the bank A.

In order to implement the above stated operations, the delay times tD1 to tD3 are set so as to satisfy requirements described below. Firstly, it is necessary to stop the equalization of the global I/O lines GIO so as not to corrupt the data thereon, when any of the column select signal lines YSW is activated. To satisfy this requirement, the delay time tD1 of the GIO equalization timing signal /EQ is determined as being equal to the delay time tD2 of the column select timing signals YSWS_A and YSWS_B.

Additionally, in order to prevent the global I/O lines GIO from being affected by noise due to the switching of the I/O switch timing signals SWIO_A and SWIO_B, the I/O switch timing signals SWIO_A and SWIO_B are switched while none of the column select signal lines YSW is activated. Specifically, the delay time tD3 of the I/O switch timing signals SWIO_A and SWIO_B (or of the column activation signals RSW_A and RWS_B) is set so as to satisfy the following equation:

$$tD1 - \tfrac{1}{2}tCK < tD3 + \alpha < tD1, \qquad (7)$$

where $\alpha$ denotes a delay time of the SWIO control circuits 50, and tCK denotes the duration of the cycle of the internal clock ICLK. From equation (4), the following equations (5) and (6) can be obtained, which express a margin t1 between the activation timings of the I/O switch signals SWIO_A and SWIO_B and the column select timing signals YSWS_A and YSWS_B, and a margin t2 between the deactivation timings of the I/O switch signals SWIO_A and SWIO_B and the column select timing signals YSWS_A and YSWS_B:

$$t1 = tD1 - (tD3 + \alpha) \qquad (8)$$

$$t2 = (tD3 + \alpha) - (tD1 - \tfrac{1}{2}tCK) \qquad (9)$$

This embodiment is suitable to the case where the margin t1 is allowed to be sufficiently provided.

As is the case of the first embodiment, the semiconductor memory device in this embodiment is also advantageous for reducing the operating current. The I/O switch timing signals SWIO_A and SWIO_B are activated in response to the issue of the first read command after the issue of the ACT command, and deactivated in response to the issue of the PRE command. That is, the I/O switch timing signals SWIO_A and SWIO_B are activated and deactivated substantially in synchronization with row cycles or RAS cycles. This effectively reduces the number of times of switching of the I/O switch timing signals SWIO_A and SWIO_B, and thereby reduces the operating current of the semiconductor memory device, as compared with the case where the I/O switch timing signals SWIO_A and SWIO_B are switched in synchronization with column cycles.

In summary, the semiconductor memory device in the above-described embodiments are designed so that the states of the I/O switching timing signals SWIO_A and SWIO_B are maintained until the associated banks A and B get out of the row active state, after once the I/O switch timing signals SWIO_A and SWIO_B, which are used to control the connections between the local I/O lines LIO and the global I/O lines GIO, are activated. In other words, the I/O switch timing signals SWIO_A and SWIO_B are switched in synchronization with RAS cycles (or substantially in synchronization with RAS cycles). This effectively avoid frequent switching of the I/O switch timing signals SWIO_A and SWIO_B, and thereby reduces the operating current of the memory device.

It is apparent that the present invention is not limited to the above-described embodiments, which may be modified and changed without departing from the scope of the invention.

It should be especially noted that the present invention is also applicable to a semiconductor memory device including three or more banks, although semiconductor memory devices including two banks are described in the specification.

What is claimed is:

1. A semiconductor memory device comprising:
a plurality of banks each including a plurality of sub-arrays arranged in rows and columns, wherein each of sub-arrays comprising memory cells arranged in rows columns;
global I/O lines shared by said plurality of banks;
local I/O lines disposed for every a number of sub-arrays within each of said plurality of banks;
I/O switch control circuits responsive to respective I/O switch timing signals for establishing connections between said global I/O lines and said local I/O lines within each of said plurality of banks; and
a timing control circuit controlling said I/O switch timing signals so that each of said I/O switch timing signals remains activated until associated one of said plurality of banks gets out of a row active state after once said each of said I/O switch timing signals is activated.

2. The semiconductor memory device according to claim 1, wherein said timing control circuit activates said one of said I/O switch timing signals in response to said associated one of said plurality of banks being placed into said row active state, and deactivates said one of said I/O switch timing signals in response to said associated one of said plurality of banks getting out of said row active state.

3. The semiconductor memory device according to claim 1, wherein said timing control circuit switches said I/O switch timing signals with associated ones of column select timing signals deactivated, said column select timing signals being indicative of timings of establishing connections between selected bit lines and said local I/O lines within said plurality of banks associated therewith.

4. The semiconductor memory device according to claim 3, wherein said timing control circuit includes:
a row logic circuit developing row select timing signals indicative of respective timings of activations of selected rows of said subarrays within said plurality of banks associated therewith;
an I/O logic circuit developing said I/O switch timing signals; and
a column logic circuit developing said column select timing signals.

5. The semiconductor memory device according to claim 4, wherein said row logic circuit comprises:
a first latch circuit latching command signals indicative of issues of commands indicating activation and deactivation of associated one of said plurality of banks in synchronization with an internal clock signal, said first latch circuit developing associated one of said row select timing signals on output thereof,
wherein said column logic circuit develops said column select timing signals in synchronization with said internal clock signal, and
wherein said I/O logic circuit comprises:
a second latch circuits latching said associated one of said row select timing signals from said first latch circuit in synchronization with said internal clock signal to develop associated one of said I/O switch timing signals.

6. The semiconductor memory device according to claim 5, wherein said first latch circuit latches said command signals upon rising edges of said internal clock signal, and
wherein said second latch circuit latches said associated one of said row select timing signals upon falling edges of said internal clock signal.

7. The semiconductor memory device according to claim 6, wherein said column logic circuit and said I/O logic circuit are designed to establish the following equation:

$$tD3+\alpha < tD1+\tfrac{1}{2}tCK,$$

where tCK is a duration of a cycle of said internal clock signal, tD1 is a delay time of said column logic signal, tD3 is a delay time of said I/O logic circuit, and α is a delay time of said I/O switch control circuits.

8. The semiconductor memory device according to claim 7, wherein said column logic circuit and said I/O logic circuit are designed to further establish the following equation:

$$tD1 < tD3+\alpha.$$

9. The semiconductor memory device according to claim 4, further comprising:
selector circuits responsive to said respective row select timing signals to develop row select signals selecting said respective rows of said sub-arrays within each of said plurality of banks,
wherein said I/O switch control circuits each comprise an AND gate receiving associated one of said I/O switch timing signals, and associated one of said row select signals.

10. The semiconductor memory device according to claim 4, further comprising:
selector circuits responsive to said row select timing signals to develop row select signals selecting said respective rows of said sub-arrays,
wherein said I/O switch control circuits each receive associated one of said I/O switch timing signals and associated one of said row select signals, and establishes connections between said global I/O lines and said local I/O lines associated therewith in response to activation of both of said associated one of said I/O switch timing signals and said associated one of said row seiect signals, while disconnects said global I/O lines from said local I/O lines associated therewith in response to deactivation of said associated one of said I/O switch timing signals.

11. The semiconductor memory device according to claim 10, wherein said I/O switch control circuits each include:
a P-channel transistor having a source connected to a power supply terminal;
a first N-channel transistor having a drain connected to a drain of said P-channel transistor; and
a second N-channel transistor having a source connected to an earth terminal and a drain connected to a source of said N-channel transistor,
wherein said associated one of said I/O switch timing signals is fed to commonly-connected gates of said P-channel transistor and said first N-channel transistor, and
wherein said associated one of said row select signals is fed to a gate of said second N-channel transistor.

12. The semiconductor memory device according to claim 4, wherein said row logic circuit comprises:
a first latch circuit latching command signals indicative of issues of commands indicating activation and deactivation of said plurality of banks in synchronization with an internal clock signal, said first latch circuit developing said row select timing signals on outputs thereof,
wherein said column logic circuit develops said column select timing signals in synchronization with said internal clock signal, and wherein said I/O logic circuit comprises:
- a flipflop designed to be set in response to an issue of a read command indicating a read operation of associated one of said plurality of banks, and to be reset in response to an issue of commands indicating deactivation of said associated one of plurality of banks; and
- a second latch circuit latching an output signal of said flipflop in synchronization with said internal clock signal to develop associated one of said I/O switch timing signals.

13. The semiconductor memory device according to claim 12, wherein said second latch circuit latches said output signal of said flipflop upon rising edges of said internal clock signal.

14. The semiconductor memory device according to claim 13, wherein said column logic circuit and said I/O logic circuit are designed to establish the following equation:

$$tD3+\alpha<tD1,$$

where tD1 is a delay time of said column logic signal, tD3 is a delay time of said I/O logic circuit, and α is a delay time of said I/O switch control circuits.

15. The semiconductor memory device according to claim 14, wherein said column logic circuit and said I/O logic circuit are designed to further establish the following equation:

$$tD1-\tfrac{1}{2}tCK<tD3+\alpha,$$

where tCK is a duration of a cycle of said internal clock signal.

16. The semiconductor memory device according to claim 12, further comprising:
- selector circuits responsive to said respective row select timing signals to develop row select signals selecting said respective rows of said sub-arrays within each of said plurality of banks, wherein said I/O switch control circuits each comprise an AND gate receiving associated one of said I/O switch timing signals, and associated one of said row select signals.

17. The semiconductor memory device according to claim 1, wherein said semiconductor memory device is a synchronous dynamic random access memory.

18. A semiconductor memory device comprising:
- a plurality of banks each including a plurality of sub-arrays arranged in rows and columns, wherein each of sub-arrays comprising memory cells arranged in rows columns;
- global I/O lines shared by said plurality of banks;
- local I/O lines disposed for every a number of sub-arrays within each of said plurality of banks;
- I/O switch control circuits responsive to respective I/O switch timing signals for establishing connections between said global I/O lines and said local I/O lines within each of said plurality of banks; and
- a timing control circuit activating and deactivating said I/O switch timing signals in synchronization with RAS cycles.

19. The semiconductor memory device according to claim 18, wherein said semiconductor memory device is a synchronous dynamic random access memory.

* * * * *